United States Patent
Gu et al.

(10) Patent No.: US 12,165,830 B2
(45) Date of Patent: Dec. 10, 2024

(54) MULTIPLE CHARGED-PARTICLE BEAM APPARATUS WITH LOW CROSSTALK

(71) Applicant: ASML Netherlands B.V., Veldhoven (NL)

(72) Inventors: Shichen Gu, San Jose, CA (US); Weiming Ren, San Jose, CA (US); Qingpo Xi, Fremont, CA (US)

(73) Assignee: ASML Netherlands B.V., Veldhoven (NL)

( * ) Notice: Subject to any disclaimer, the term of this patent is extended or adjusted under 35 U.S.C. 154(b) by 351 days.

(21) Appl. No.: 17/708,517

(22) Filed: Mar. 30, 2022

(65) Prior Publication Data

US 2022/0319797 A1     Oct. 6, 2022

Related U.S. Application Data

(60) Provisional application No. 63/168,239, filed on Mar. 30, 2021.

(51) Int. Cl.
    *H01J 37/09*     (2006.01)
    *H01J 37/20*     (2006.01)
    *H01J 37/28*     (2006.01)

(52) U.S. Cl.
    CPC ............. *H01J 37/09* (2013.01); *H01J 37/20* (2013.01); *H01J 37/28* (2013.01);
(Continued)

(58) Field of Classification Search
    CPC .. H01J 37/00; H01J 37/02; H01J 37/09; H01J 37/20; H01J 37/28; H01J 37/26;
(Continued)

(56) References Cited

U.S. PATENT DOCUMENTS

| | | | | |
|---|---|---|---|---|
| 2006/0016989 A1* | 1/2006 | Nakasuji | ............... | H01J 37/244 250/310 |
| 2007/0057186 A1* | 3/2007 | Nakasuji | ............... | H01J 37/075 250/310 |

(Continued)

FOREIGN PATENT DOCUMENTS

| | | |
|---|---|---|
| CN | 108738343 A | 11/2018 |
| TW | I288424 B | 11/2007 |
| TW | 201942941 A | 11/2019 |

OTHER PUBLICATIONS

Office Action of the Intellectual Property Office of Taiwan issued in related Taiwanese Patent Application No. 111110450; mailed Jan. 6, 2023 (14 pgs.).

*Primary Examiner* — Jason L McCormack
(74) *Attorney, Agent, or Firm* — Finnegan, Henderson, Farabow, Garrett & Dunner, LLP

(57) ABSTRACT

Systems and methods of enhancing imaging resolution by reducing crosstalk between detection elements of a secondary charged-particle detector in a multi-beam apparatus are disclosed. The multi-beam apparatus may comprise an electro-optical system comprising a beam-limit aperture plate having a surface substantially perpendicular to an optical axis, the beam-limit aperture plate comprising a first aperture at a first distance relative to the surface of the beam-limit aperture plate, and a second aperture at a second distance relative to the surface of the beam-limit aperture plate, the second distance being different from the first distance. The first aperture may be a part of a first set of apertures of the beam-limit aperture plate at the first distance, and the second aperture may be a part of a second set of apertures of the beam-limit aperture plate at the second distance.

20 Claims, 12 Drawing Sheets

(side view)

(52) U.S. Cl.
CPC ............... *H01J 2237/0453* (2013.01); *H01J 2237/1504* (2013.01); *H01J 2237/24592* (2013.01); *H01J 2237/2806* (2013.01)

(58) Field of Classification Search
CPC ............ H01J 37/265; H01J 2237/0453; H01J 2237/1504; H01J 2237/24592; H01J 2237/2806; H01J 2237/0455; H01J 2237/24465; H01J 2237/2448
USPC ........................................ 250/306, 307, 311
See application file for complete search history.

(56) References Cited

U.S. PATENT DOCUMENTS

| | | | |
|---|---|---|---|
| 2017/0154756 A1 | 6/2017 | Ren et al. | |
| 2019/0122852 A1* | 4/2019 | Zeidler | H01J 37/28 |
| 2020/0381207 A1 | 12/2020 | Ren et al. | |

* cited by examiner (top view)

(side view)

(top view)

(top view)

(top view)

(side view)

(top view)

(side view)

(top view)

(side view)

(top view)

1100

Determining a position of a crossover plane associated with a plurality of secondary charged-particle beams generated from the sample. ⟶ 1110

Determining a location for moving the beam-limit aperture plate to position one of a plurality of apertures of the beam-limit aperture plate in the crossover plane to cause the one of the plurality of apertures to align with the plurality of secondary charged-particle beams, wherein the beam-limit aperture plate has a surface positioned substantially perpendicular to an optical axis, the beam-limit aperture plate comprising a first aperture at a first distance relative to the surface of the beam-limit aperture plate, and a second aperture at a second distance relative to the surface of the beam-limit aperture plate, the second distance being different from the first distance. ⟶ 1120

Moving, according to the determined location, the beam-limit aperture plate along a second axis substantially perpendicular to the optical axis to position the one of the plurality of apertures to be aligned with the plurality of secondary charged-particle beams that overlap to form the crossover plane. ⟶ 1130

FIG. 11

MULTIPLE CHARGED-PARTICLE BEAM APPARATUS WITH LOW CROSSTALK

CLAIM FOR PRIORITY

This application claims priority to Provisional Application No. 63/168,239, which was filed on Mar. 30, 2021, and is incorporated herein by reference in its entirety.

TECHNICAL FIELD

The embodiments provided herein disclose a multi-beam apparatus, and more particularly a multi-beam charged particle microscope with enhanced imaging signal fidelity using an aperture plate integrated with multiple aperture arrays configured to reduce crosstalk.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, accuracy and yield in defect detection become more important. Although multiple electron beams may be used to increase the throughput, the limitation in fidelity of imaging signals received by charged-particle detectors may limit the imaging resolution desired for reliable defect detection and analysis rendering the inspection tools inadequate for their desired purpose.

SUMMARY

In some embodiments of the present disclosure, an electro-optical system of a multi charged-particle beam apparatus is disclosed. The electro-optical system may comprise a beam-limit aperture plate having a surface that is substantially perpendicular to an optical axis. The beam-limit aperture plate comprises a first aperture at a first distance relative to the surface of the beam-limit aperture plate, and a second aperture at a second distance relative to the surface of the beam-limit aperture plate. The second distance is different from the first distance.

In another embodiment of the present disclosure, a multi charged-particle beam apparatus is disclosed. The multi charged-particle beam apparatus comprises an electro-optical system for projecting a plurality of secondary charged-particle beams from a sample onto a charged-particle detector. The electro-optical system comprises a beam-limit aperture plate having a surface that is substantially perpendicular to an optical axis. The beam-limit aperture plate comprises a first aperture at a first distance relative to the surface of the beam-limit aperture plate, and a second aperture at a second distance relative to the surface of the beam-limit aperture plate. The second distance is different from the first distance. The charged-particle detector includes a plurality of detection elements, where a respective detection element of the plurality of detection elements is associated with a corresponding beam of a plurality of secondary charged-particle beams.

In some embodiments of the present disclosure, a method performed of controlling a beam-limit aperture plate of a secondary imaging system to form images of a sample is disclosed. The method comprises determining a position of a crossover plane associated with a plurality of secondary charged-particle beams generated from the sample. The method also comprises determining a location for moving the beam-limit aperture plate to position one of a plurality of apertures of the beam-limit aperture plate in the crossover plane to cause the one of the plurality of apertures to align with the plurality of secondary charged-particle beams. The beam-limit aperture plate has a surface positioned substantially perpendicular to an optical axis. The beam-limit aperture plate comprises a first aperture of the plurality of apertures, where the first aperture is at a first distance relative to the surface of the beam-limit aperture plate. The beam-limit aperture plate also comprises a second aperture of the plurality of apertures, where the second aperture is at a second distance relative to the surface of the beam-limit aperture plate, the second distance being different from the first distance. The method further comprises moving, according to the determined location, the beam-limit aperture plate along a second axis substantially perpendicular to the optical axis to position the one of the plurality of apertures to be aligned with the plurality of secondary charged-particle beams that overlap to form the crossover plane.

In some embodiments of the present disclosure, a non-transitory computer readable medium that stores a set of instructions that is executable by at least one processor of an electro-optical system to cause the electro-optical system to perform a method of controlling a beam-limit aperture plate of the electro-optical system to form images of a sample is disclosed. The method comprises determining a position of a crossover plane associated with a plurality of secondary charged-particle beams generated from the sample. The method further comprises determining a location for moving the beam-limit aperture plate to position one of a plurality of apertures of the beam-limit aperture plate in the crossover plane to cause the one of the plurality of apertures to align with the plurality of secondary charged-particle beams. The beam-limit aperture plate has a surface positioned substantially perpendicular to an optical axis. The beam-limit aperture plate comprises a first aperture and a second aperture of the plurality of apertures, the first aperture at a first distance relative to the surface of the beam-limit aperture plate, and the second aperture at a second distance relative to the surface of the beam-limit aperture plate, the second distance being different from the first distance. The method further comprises moving, according to the determined location, the beam-limit aperture plate along a second axis substantially perpendicular to position the one of the plurality of apertures to be aligned with the plurality of secondary charged-particle beams that overlap to form the crossover plane.

Other advantages of the embodiments of the present disclosure will become apparent from the following description taken in conjunction with the accompanying drawings wherein are set forth, by way of illustration and example, certain embodiments of the present invention.

BRIEF DESCRIPTION OF FIGURES

FIG. 11 is a process flowchart representing an exemplary method of controlling a beam-limit aperture plate of a secondary imaging system of FIG. 5 to form images of a sample, consistent with embodiments of the present disclosure.

DETAILED DESCRIPTION

Figure 1:
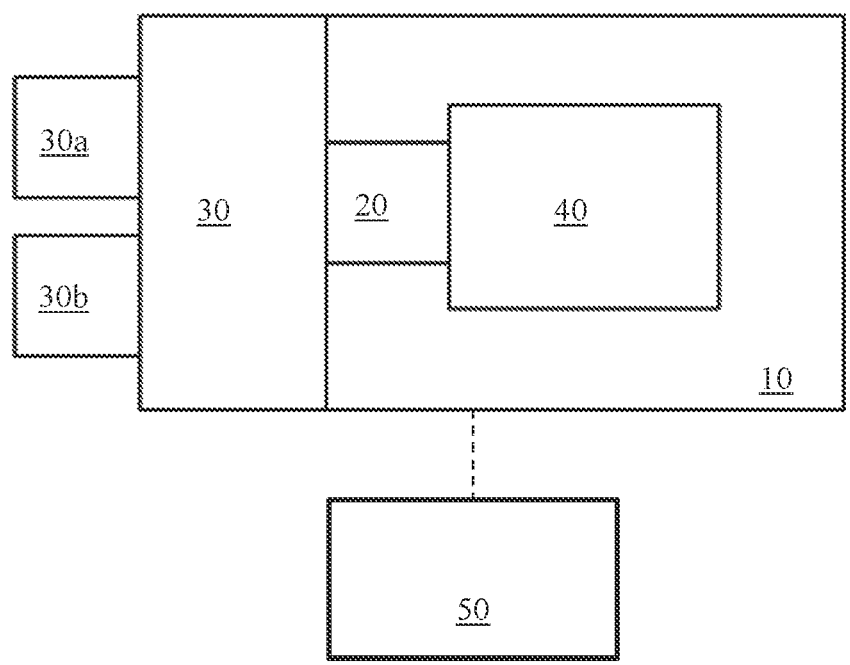
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the disclosed embodiments as recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC, rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur.

Although a multiple charged-particle beam imaging system, such as a multi-beam SEM, may be useful in increasing the wafer inspection throughput, the imaging resolution of a multi-beam SEM may be limited by the quality of the imaging signals received and detected by the secondary electron detection system. A secondary charged-particle beam, such as an electron beam generated by the interaction of primary beamlets on sample surface, may comprise secondary electrons with a large energy spread (e.g., ~50 eV, or higher) and a large emission angle range (e.g., ~90°) with respect to a normal of the sample surface. In conventional multi-beam SEMs, the secondary electron beam may be incident upon multiple detection elements of the secondary electron detector. In other words, each of the multiple detection elements may receive secondary electrons from a corresponding secondary electron beam and other adjacent beams. Consequently, the imaging signal of one detection element may comprise a main component originating from the corresponding secondary electron beam and a crosstalk component originating from adjacent electron beams. The crosstalk component, among other things, may deteriorate the fidelity of the imaging signal. Therefore, it is desirable to minimize crosstalk between multiple detection elements to enhance the imaging resolution.

To mitigate the occurrence of crosstalk, an aperture mechanism may be employed in a secondary imaging system to block off peripheral secondary electrons. It is desirable to have the aperture hole at the height where the secondary electron beam radius (R) is at its minimum value, at the crossover point of the secondary electrons, to block peripheral electrons. However, the secondary electron beam radius may change with energies of the primary beamlets, excitations of objective lens, or the height where the secondary electrons land on the aperture. As a result, the secondary electron beam radius may have minimum values at different heights (e.g., along the z axis parallel to the secondary optical axis). But a flat aperture that can move only in the x or y axes relative to the optical axis (z direction) of the secondary imaging system cannot accommodate this requirement, resulting in compromised image quality caused by the crosstalk component detected at the secondary electron detector. It is desirable to move the aperture hole in the z direction, but without the expense and extra space required for machinery to enable the aperture plate to move in the z direction.

In some embodiments of the present disclosure, a multi-beam apparatus may include an electro-optical system for projecting a plurality of secondary electrons from a sample onto a charged-particle detector. The electro-optical system may comprise a beam-limit aperture plate comprising multiple sets of apertures (e.g., aperture arrays) placed at different heights, so that by moving the beam-limit aperture plate in the x or y directions, the aperture holes can appear at desired heights to accommodate the variations of the secondary electron beam radius due to different conditions, such as energies of primary beamlets, objective lens excitations, etc. As such, the application of a beam-limit aperture plate including multiple beam-limit aperture arrays placed at different heights in the z axis may mitigate the crosstalk between detection elements and enhance imaging resolution.

Relative dimensions of components in drawings may be exaggerated for clarity. Within the following description of drawings, the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Reference is now made to FIG. 1, which illustrates an exemplary electron beam inspection (EBI) system 100 consistent with embodiments of the present disclosure. As shown in FIG. 1, charged particle beam inspection system 100 includes a main chamber 10, a load-lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load-lock chamber 20.

Load-lock chamber 20 is connected to a load/lock vacuum pump system (not shown), which removes gas molecules in load-lock chamber 20 to reach a first pressure below the atmospheric pressure. After reaching the first pressure, one or more robot arms (not shown) transport the wafer from load-lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40. In some embodiments, electron beam tool 40 may comprise a single-beam inspection tool. In other embodiments, electron beam tool 40 may comprise a multi-beam inspection tool.

Controller 50 may be electronically connected to electron beam tool 40 and may be electronically connected to other components as well. Controller 50 may be a computer configured to execute various controls of charged particle beam inspection system 100. Controller 50 may also include processing circuitry configured to execute various signal and image processing functions. While controller 50 is shown in FIG. 1 as being outside of the structure that includes main chamber 10, load-lock chamber 20, and EFEM 30, it is appreciated that controller 50 can be part of the structure.

While the present disclosure provides examples of main chamber 10 housing an electron beam inspection system, it should be noted that aspects of the disclosure in their broadest sense, are not limited to a chamber housing an electron beam inspection system. Rather, it is appreciated that the foregoing principles may be applied to other chambers as well.

Figure 2:
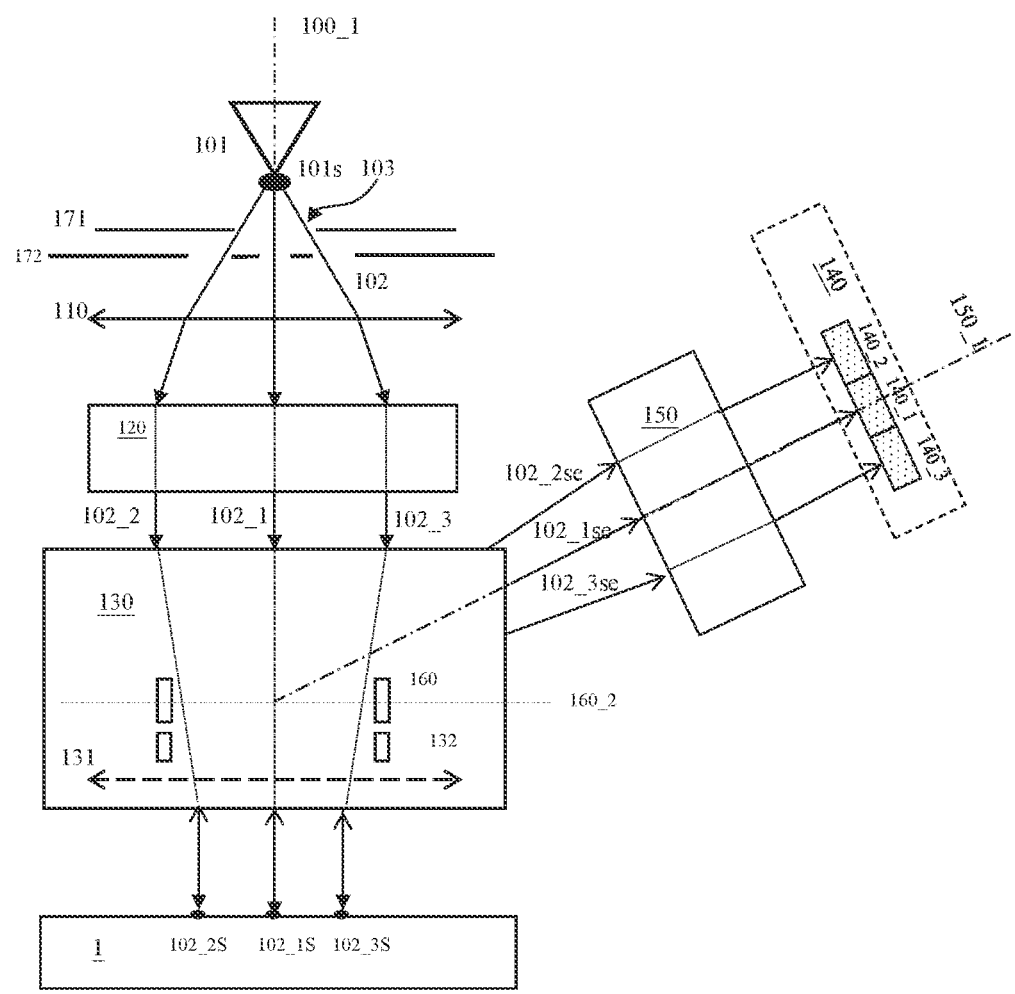
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates a schematic diagram illustrating an exemplary electron beam tool 40 that can be a part of the exemplary charged particle beam inspection system 100 of FIG. 1, consistent with embodiments of the present disclosure. An electron beam tool 40 (also referred to herein as apparatus 40) comprises an electron source 101, a gun aperture plate 171 with a gun aperture 103, a pre-beamlet forming mechanism 172, a condenser lens 110, a source conversion unit 120, a primary projection optical system 130, a sample stage (not shown in FIG. 2), a secondary imaging system 150, and an electron detection device 140. Primary projection optical system 130 can comprise an objective lens 131. Electron detection device 140 can comprise a plurality of detection elements 140_1, 140_2, and 140_3. Beam separator 160 and deflection scanning unit 132 can be placed inside primary projection optical system 130. It may be appreciated that other commonly known components of apparatus 40 may be added/omitted as appropriate.

Electron source 101, gun aperture plate 171, condenser lens 110, source conversion unit 120, beam separator 160, deflection scanning unit 132, and primary projection optical system 130 can be aligned with a primary optical axis 100_1 of apparatus 100. Secondary imaging system 150 and electron detection device 140 can be aligned with a secondary optical axis 150_1 of apparatus 40.

Electron source 101 can comprise a cathode, an extractor or an anode, wherein primary electrons can be emitted from the cathode and extracted or accelerated to form a primary electron beam 102 that forms a crossover (virtual or real) 101s. Primary electron beam 102 can be visualized as being emitted from crossover 101s.

Source conversion unit 120 may comprise an image-forming element array (not shown in FIG. 2), an aberration compensator array (not shown), a beam-limit aperture array (not shown), and a pre-bending micro-deflector array (not shown). The image-forming element array can comprise a plurality of micro-deflectors or micro-lenses to form a plurality of parallel images (virtual or real) of crossover 101s with a plurality of beamlets of primary electron beam 102. FIG. 2 shows three beamlets 102_1, 102_2, and 102_3 as an example, and it is appreciated that the source conversion unit 120 can handle any number of beamlets.

In some embodiments, source conversion unit 120 may be provided with beam-limit aperture array and image-forming element array (both are not shown). The beam-limit aperture array may comprise beam-limit apertures. It is appreciated that any number of apertures may be used, as appropriate. Beam-limit apertures may be configured to limit sizes of beamlets 102_1, 102_2, and 102_3 of primary-electron beam 102. The image-forming element array may comprise image-forming deflectors (not shown) configured to deflect beamlets 102_1, 102_2, and 102_3 by varying angles towards primary optical axis 100_1. In some embodiments, deflectors further away from primary optical axis 100_1 may deflect beamlets to a greater extent. Furthermore, image-forming element array may comprise multiple layers (not illustrated), and deflectors may be provided in separate layers. Deflectors may be configured to be individually controlled independent from one another. In some embodiments, a deflector may be controlled to adjust a pitch of probe spots (e.g., 102_1S, 102_2S, and 102_3S) formed on a surface of sample 1. As referred to herein, pitch of the probe spots may be defined as the distance between two immediately adjacent probe spots on the surface of sample 1.

A centrally located deflector of image-forming element array may be aligned with primary optical axis 100_1 of electron beam tool 40. Thus, in some embodiments, a central deflector may be configured to maintain the trajectory of beamlet 102_1 to be straight. In some embodiments, the central deflector may be omitted. However, in some embodiments, primary electron source 101 may not necessarily be aligned with the center of source conversion unit 120. Furthermore, it is appreciated that while FIG. 2 shows a side view of apparatus 40 where beamlet 102_1 is on primary optical axis 100_1, beamlet 102_1 may be off primary optical axis 100_1 when viewed from a different side. That is, in some embodiments, all of beamlets 102_1, 102_2, and 102_3 may be off axis. An off-axis component may be offset relative to primary optical axis 100_1.

The deflection angles of the deflected beamlets may be set based on one or more criteria. In some embodiments, deflectors may deflect off-axis beamlets radially outward or away (not illustrated) from primary optical axis 100_1. In some embodiments, deflectors may be configured to deflect off-axis beamlets radially inward or towards primary optical axis 100_1. Deflection angles of the beamlets may be set so that beamlets 102_1, 102_2, and 102_3 land perpendicularly on sample 1. Off-axis aberrations of images due to lenses, such as objective lens 131, may be reduced by adjusting paths of the beamlets passing through the lenses. Therefore, deflection angles of off-axis beamlets 102_2 and 102_3 may be set so that probe spots 102_2S and 102_3S have small aberrations. Beamlets may be deflected so as to pass through or close to the front focal point of objective lens 131 to decrease aberrations of off-axis probe spots 102_2S and 102_3S. In some embodiments, deflectors may be set to make beamlets 102_1, 102_2, and 102_3 land perpendicularly on sample 1 while probe spots 102_1S, 102_2S, and 102_3S have small aberrations.

Condenser lens 110 is configured to focus primary electron beam 102. The electric currents of beamlets 102_1, 102_2, and 102_3 downstream of source conversion unit 120 can be varied by adjusting the focusing power of condenser lens 110 or by changing the radial sizes of the corresponding beam-limit apertures within the beam-limit aperture array. The electric currents may be changed by both, altering the radial sizes of beam-limit apertures and the focusing power of condenser lens 110. Condenser lens 110 may be an adjustable condenser lens that may be configured so that the position of its first principle plane is movable. The adjustable condenser lens may be configured to be magnetic, which may result in off-axis beamlets 102_2 and 102_3 illuminating source conversion unit 120 with rotation angles. The rotation angles may change with the focusing power or the position of the first principal plane of the adjustable condenser lens. Accordingly, condenser lens 110 may be an anti-rotation condenser lens that may be configured to keep the rotation angles unchanged while the focusing power of condenser lens 110 is changed. In some embodiments, condenser lens 110 may be an adjustable anti-rotation condenser lens, in which the rotation angles do not change when the focusing power and the position of the first principal plane of condenser lens 110 are varied.

Electron beam tool 40 may comprise pre-beamlet forming mechanism 172. In some embodiments, electron source 101 may be configured to emit primary electrons and form a primary electron beam 102. In some embodiments, gun aperture plate 171 may be configured to block off peripheral electrons of primary electron beam 102 to reduce the Coulomb effect. In some embodiments, pre-beamlet-forming mechanism 172 further cuts the peripheral electrons of primary electron beam 102 to further reduce the Coulomb effect. Primary-electron beam 102 may be trimmed into three primary electron beamlets 102_1, 102_2, and 102_3 (or any other number of beamlets) after passing through pre-beamlet forming mechanism 172. Electron source 101, gun aperture plate 171, pre-beamlet forming mechanism 172, and condenser lens 110 may be aligned with a primary optical axis 100_1 of electron beam tool 40.

Pre-beamlet forming mechanism 172 may comprise a Coulomb aperture array. A center aperture, also referred to herein as the on-axis aperture, of pre-beamlet-forming mechanism 172 and a central deflector of source conversion unit 120 may be aligned with primary optical axis 100_1 of electron beam tool 40. Pre-beamlet-forming mechanism 172 may be provided with a plurality of pre-trimming apertures (e.g., a Coulomb aperture array). In FIG. 2, the three beamlets 102_1, 102_2 and 102_3 are generated when primary electron beam 102 passes through the three pre-trimming apertures, and much of the remaining part of primary electron beam 102 is cut off That is, pre-beamlet-forming mechanism 172 may trim much or most of the electrons from primary electron beam 102 that do not form the three beamlets 102_1, 102_2 and 102_3. Pre-beamlet-forming mechanism 172 may cut off electrons that will ultimately not be used to form probe spots 102_1S, 102_2S and 102_3S before primary electron beam 102 enters source conversion unit 120. In some embodiments, a gun aperture plate 171 may be provided close to electron source 101 to cut off electrons at an early stage, while pre-beamlet forming mechanism 172 may also be provided to further cut off electrons around a plurality of beamlets. Although FIG. 2 demonstrates three apertures of pre-beamlet forming mechanism 172, it is appreciated that there may be any number of apertures, as appropriate.

In some embodiments, pre-beamlet forming mechanism 172 may be placed below condenser lens 110. Placing pre-beamlet forming mechanism 172 closer to electron source 101 may more effectively reduce the Coulomb effect. In some embodiments, gun aperture plate 171 may be omitted when pre-beamlet forming mechanism 172 is able to be located sufficiently close to source 101 while still being manufacturable.

Objective lens 131 may be configured to focus beamlets 102_1, 102_2, and 102_3 onto a sample 1 for inspection and can form three probe spots 102_1s, 102_2s, and 102_3s on surface of sample 1. Gun aperture plate 171 can block off peripheral electrons of primary electron beam 102 not in use to reduce Coulomb interaction effects. Coulomb interaction effects can enlarge the size of each of probe spots 102_1s, 102_2s, and 102_3s, and therefore deteriorate inspection resolution.

Beam separator 160 may be a beam separator of Wien filter type comprising an electrostatic deflector generating an electrostatic dipole field μl and a magnetic dipole field B1 (both of which are not shown in FIG. 2). If they are applied, the force exerted by electrostatic dipole field μl on an electron of beamlets 102_1, 102_2, and 102_3 is equal in magnitude and opposite in direction to the force exerted on the electron by magnetic dipole field B1. Beamlets 102_1, 102_2, and 102_3 can therefore pass straight through beam separator 160 with zero deflection angles.

Deflection scanning unit 132 can deflect beamlets 102_1, 102_2, and 102_3 to scan probe spots 102_1s, 102_2s, and 102_3s over three small scanned areas in a section of the surface of sample 1. In response to incidence of beamlets 102_1, 102_2, and 102_3 at probe spots 102_1s, 102_2s, and 102_3s, three secondary electron beams 102_1se, 102_2se, and 102_3se may be emitted from sample 1. Each of secondary electron beams 102_1se, 102_2se, and 102_3se can comprise electrons with a distribution of energies including secondary electrons (energies≤50 eV) and backscattered electrons (energies between 50 eV and landing energies of beamlets 102_1, 102_2, and 102_3). Beam separator 160 can direct secondary electron beams 102_1se, 102_2se, and 102_3se towards secondary imaging system 150. Secondary imaging system 150 can focus secondary electron beams 102_1se, 102_2se, and 102_3se onto detection elements 1401, 1402, and 1403 of electron detection device 140. Detection elements 140_1, 1402, and 140_3 can detect corresponding secondary electron beams 102_1se, 102_2se, and 102_3se and generate corresponding signals used to construct images of the corresponding scanned areas of sample 1.

In FIG. 2, three secondary electron beams 102_1se, 102_2se, and 102_3se respectively generated by three probe spots 102_1S, 102_2S, and 102_3S, travel upward towards electron source 101 along primary optical axis 100_1, pass through objective lens 131 and deflection scanning unit 132 in succession. The three secondary electron beams 102_1se, 102_2se and 102_3se are diverted by beam separator 160 (such as a Wien Filter) to enter secondary imaging system 150 along secondary optical axis 150_1 thereof. Secondary imaging system 150 focuses the three secondary electron beams 102_1se~102_3se onto electron detection device 140 which comprises three detection elements 140_1, 1402, and 140_3. Therefore, electron detection device 140 can simultaneously generate the images of the three scanned regions scanned by the three probe spots 102_1S, 102_2S and 102_3S, respectively. In some embodiments, electron detection device 140 and secondary imaging system 150 form one detection unit (not shown). In some embodiments, the electron optics elements on the paths of secondary electron beams such as, but not limited to, objective lens 131, deflection scanning unit 132, beam separator 160, secondary imaging system 150 and electron detection device 140, may form one detection system.

In some embodiments, controller 50 may comprise an image processing system that includes an image acquirer (not shown) and a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 140 of apparatus 40 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 140 and may construct an image. The image acquirer may thus acquire images of sample 1. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 140. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 1. The acquired images may comprise multiple images of a single imaging area of sample 1 sampled multiple times over a time sequence. The multiple images may be stored in the storage. In some embodiments, controller 50 may be configured to perform image processing steps with the multiple images of the same location of sample 1.

In some embodiments, controller 50 may include measurement circuitries (e.g., analog-to-digital converters) to obtain a distribution of the detected secondary electrons. The electron distribution data collected during a detection time window, in combination with corresponding scan path data of each of primary beamlets 102_1, 102_2, and 102_3 incident on the wafer surface, can be used to reconstruct images of the wafer structures under inspection. The reconstructed images can be used to reveal various features of the internal or external structures of sample 1, and thereby can be used to reveal any defects that may exist in the wafer.

In some embodiments, controller 50 may control a motorized stage (not shown) to move sample 1 during inspection. In some embodiments, controller 50 may enable the motorized stage to move sample 1 in a direction continuously at a constant speed. In other embodiments, controller 50 may enable the motorized stage to change the speed of the movement of sample 1 over time depending on the steps of scanning process. In some embodiments, controller 50 may adjust a configuration of primary projection optical system 130 or secondary imaging system 150 based on images of secondary electron beams 102_1se, 102_2se, and 102_3se.

Although FIG. 2 shows that electron beam tool 40 uses three primary electron beams, it is appreciated that electron beam tool 40 may use two or more number of primary electron beams. The present disclosure does not limit the number of primary electron beams used in apparatus 40.

Figure 3:
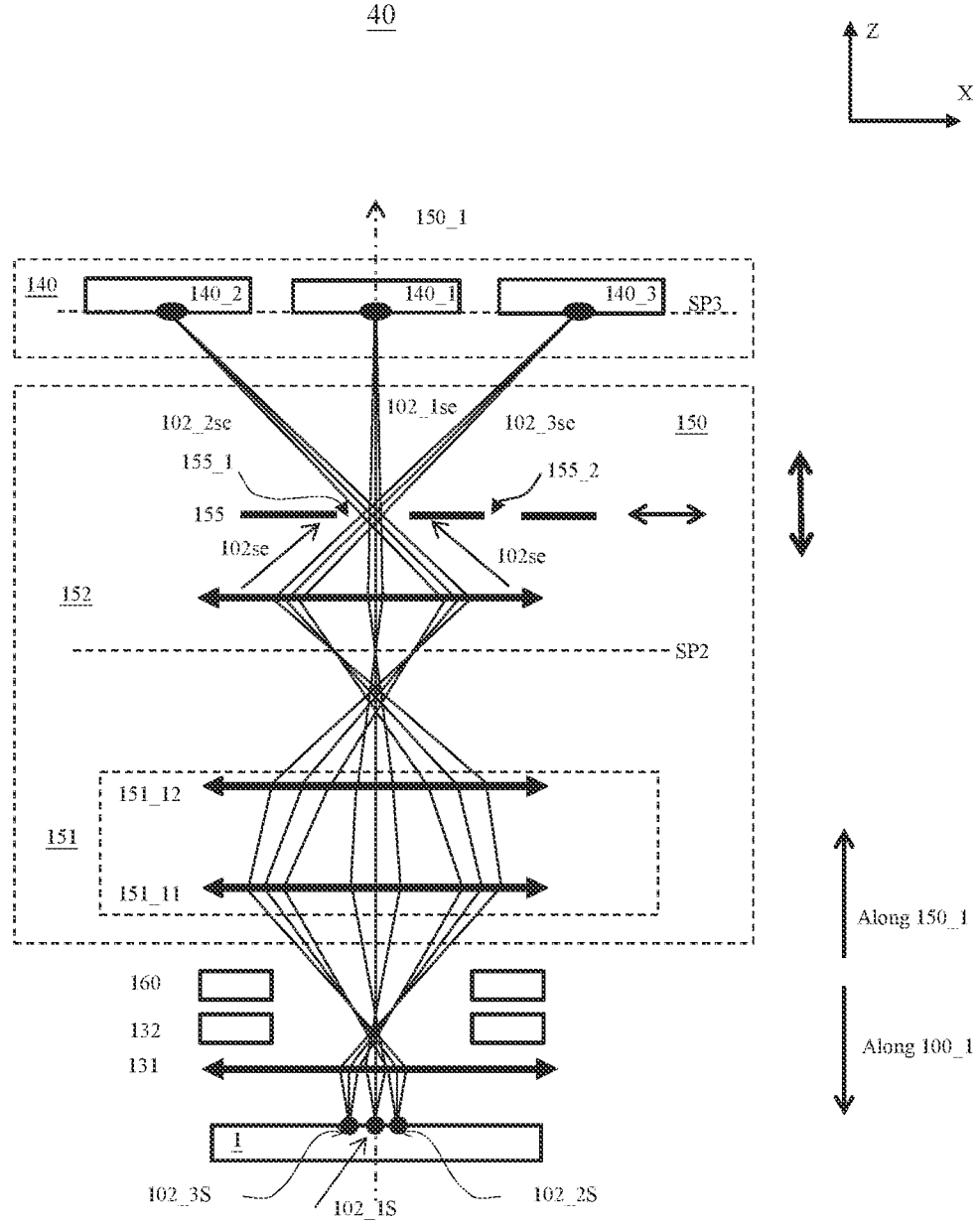
FIG. 3 is a schematic diagram illustrating an exemplary configuration of a secondary imaging system in a multi-beam apparatus, consistent with embodiments of the present disclosure.

Reference is now made to FIG. 3, which is a schematic diagram of an exemplary configuration of a secondary imaging system in a multi-beam apparatus, consistent with embodiments of the present disclosure. It is appreciated that secondary imaging system 150 may be part of charged-particle beam inspection system (e.g., electron beam inspection system 100 of FIG. 1).

In some embodiments, secondary imaging system 150 will be shown and described together with the entire detection system, as illustrated in FIG. 3. With reference to FIG. 3, only three secondary electron beams with respect to three probe spots are shown, although there may be any number of secondary electron beams. Within the entire detection system, starting from sample 1, the first part is along primary optical axis 100_1 and the second part is along secondary optical axis 150_1. For illustrative purposes only and bearing no resemblance to the actual configuration, the first part is rotated to be along secondary optical axis 150_1 such that the entire detection system can be shown along one straight optical axis.

In some embodiments, as illustrated in FIG. 3, secondary imaging system 150 may include zoom lens 151, projection lens 152, secondary beam-limit aperture array 155, and anti-scanning deflection unit (not shown), all aligned with secondary optical axis 150_1. Detection elements 140_1, 1402, and 140_3 of electron detection device 140 may be placed on a detection plane SP3, normal to secondary optical axis 150_1. Zoom lens 151, projection lens 152, and objective lens 131 together project the surface of sample 1 onto a detection plane SP3, i.e. focus the secondary electron beams 102_1se~102_3se to form secondary-electron spots on detection elements 140_1, 1402 and 140_3, respectively, when deflection scanning unit 132 is off.

In some embodiments, zoom lens 151 may comprise two electrostatic lenses 151_11 and 151_12. The image plane of zoom lens 151 may be at a transfer plane SP2, as illustrated in FIG. 3. Projection lens 152 may comprise one electrostatic lens and one magnetic lens (both are not shown), and the image plane thereof may be at detection plane SP3. The first imaging magnification M1 from the surface of sample 1 to transfer plane SP2 may be realized by objective lens 131 and zoom lens 151, whereas the second imaging magnification M2 from transfer plane SP2 to detection plane SP3 may be realized by projection lens 152, and the total imaging magnification M from the surface of sample 1 to detection plane SP3 may be determined based on M1 and M2. Specifically, the total imaging magnification M may be based on M1*M2.

In some embodiments, zoom lens 151 may be configured to perform the zoom function. By adjusting the focusing power of the two electrostatic lenses 151_11 and 151_12, the first imaging magnification M1 can be varied to achieve the desired value of the total imaging magnification M. Projection lens 152 may be configured to perform the anti-rotating function. By adjusting the magnetic field of the magnetic lens and the focusing power of the electrostatic lens, the total image rotation on detection plane SP3 and the second imaging magnification M2 can remain the same. The anti-scanning deflection unit (not shown) may be configured to perform the anti-scanning function. By synchronously deflecting the secondary electron beams with deflection scanning unit 132, the displacements of three secondary electron spots on the detection plane SP3 can be substantially canceled. Consequently, the corresponding relationship between the plurality of probe spots and the plurality of detection elements can always be kept. To reduce the additional aberrations of zoom lens 151 and projection lens 152, which come from the deflection of the secondary electron beams generated by deflection scanning unit 132, the anti-scanning deflection unit is better placed before zoom lens 151 and hence the secondary electron beams will pass through zoom lens 151 and projection lens 152 in a way as if deflection scanning unit 132 is off. However, in this case, zoom lens 151 may be placed far away from beam separator 160 and, consequently may generate large initial aberrations.

As is commonly known in the art, the emission of secondary electrons obeys Lambert's law and has a large energy spread. While the energy of a secondary electron may be up to 50 eV, most have an energy of approximately 5 eV, depending on the sample material, among other things. The landing energy of the primary electron beamlets, such as the energy of beamlet 102_1 as it lands on the sample, may be in the range of 0.1 keV to 5 keV. The landing energy may be adjusted by varying either or both of the bias of primary electron source 101 or the bias of sample 1. Therefore, the excitation of objective lens 131 may be adjusted to provide the corresponding focusing power for the three beamlets. Further, for reduced aberrations, objective lens 131 may be a magnetic or an electromagnetic compound lens configured to rotate the beamlets and affect the landing energy. Because the size, the position, or the magnification of the secondary electron spots formed by the secondary electron beams 102_1se, 102_2se, and 102_3se on detection elements 140_1, 1402, and 140_3 may vary, the secondary electron spots may partially enter a detection element adjacent to the corresponding detection element. The secondary electrons detected by the adjacent detection elements may generate image overlaps, for example, causing deterioration of image resolution. The image signal from one detection element may include information from more than one scanned region of sample 1, resulting in loss of resolution due to crosstalk.

Crosstalk in multi-beam SEMs such as EBI system 100 may be mitigated by using a secondary beam-limit aperture array 155 to cut off (or trim) the peripheral secondary electrons of the secondary electron beam such as 102_1se, for example. Secondary beam-limit aperture array 155 may comprise a plurality of apertures. Although FIG. 3 illustrates only two apertures, 155_1 and 155_2, any number of apertures may be used, as appropriate. For example, secondary beam-limit aperture array 155 illustrated in FIG. 4 (described later) comprises six apertures, 155_1, 155_2, 155_3, 155_4, 155_5, and 155_6.

In general, when the size of an aperture (e.g., aperture 155_1 of FIG. 3) of secondary beam-limit aperture 155 increases, the overall collection efficiency of a secondary electron detector may increase. However, the difference in collection efficiencies of each detection element of the detector may also increase, and the crosstalk among detection elements 140_1, 140_2, and 140_3 may increase as well. Although the increase in overall collection efficiency of electron detection device 140 increases the throughput, however, the difference in collection efficiencies of each detection element 140_1, 140_2, and 140_3 may cause the grey levels of images formed by secondary electron beams 102_1se-102_3se to differ more. One or more additional processes may be performed to eliminate the inspection errors due to the difference of grey levels, thereby decreasing inspection throughput and deteriorating resolution of the MBI apparatus. When the crosstalk among secondary electron beams 102_1se-102_3se increases, the images formed by secondary electron beams 102_1se-102_3se may be degraded. That is, large crosstalk deteriorates inspection resolution of the MBI apparatus.

In some embodiments, each of the apertures of secondary beam-limit aperture array 155 may have uniform or non-uniform size, shape, or cross-section. The smaller the radial size of an aperture, the lower the collection efficiencies and the crosstalk of the imaging signals of detection elements 140_1, 140_2, and 140_3 will generally be. Therefore, the radial size of the apertures may depend on the application or the desired outcome.

In some embodiments in which objective lens 131 functions in a non-magnetic immersion mode, the angular velocity of the emerging secondary electrons may be zero on the sample surface. In such embodiments, the chief rays of off-axis secondary electron beams 102_2se and 102_3se may still be meridional after exiting objective lens 131 and may be able to cross secondary optical axis 150_1 of secondary imaging system 150. Furthermore, the chief rays can cross secondary optical axis 150_1 at a same place (if aberrations are not considered) in secondary imaging system 150. As such, secondary electron beams 102_1se-102_3se may be configured to overlap at a common area of crossing and therefore form a relatively sharp secondary beam crossover. The plane where the common area of crossing or secondary beam crossover is located is referred to as a crossing plane or secondary beam crossover plane.

While FIG. 3 illustrates an exemplary relatively sharp secondary beam crossover plane formed by fully overlapping secondary beams 102_1se-102_3se on one crossing plane, it is appreciated that one or more of the secondary electron beams may be offset from others on the crossing plane and the secondary beam crossover may not be that sharp, forming a range of secondary beam crossover planes along secondary optical axis 150_1. The position of secondary beam crossover plane may depend on landing energies of primary beamlets or excitations of objective lens 131, among other things. In some embodiments, secondary beam-limit aperture array 155 may be positioned on the secondary beam crossover plane, or in other words, the plane of secondary beam-limit aperture array 155 may coincide with the secondary beam crossover plane. In some embodiments, the plane of secondary beam limit aperture array 155 may be within a moving range of positions of secondary beam crossover plane. Secondary beam-limit aperture array 155 may be moved along secondary beam crossover plane such that the desired aperture or aperture size may be used to block off peripheral secondary electrons directed towards electron detection device 140. In some embodiments, secondary beam-limit aperture array 155 may be placed at an optimal position within the range of positions of the secondary beam crossover plane.

Figure 4:
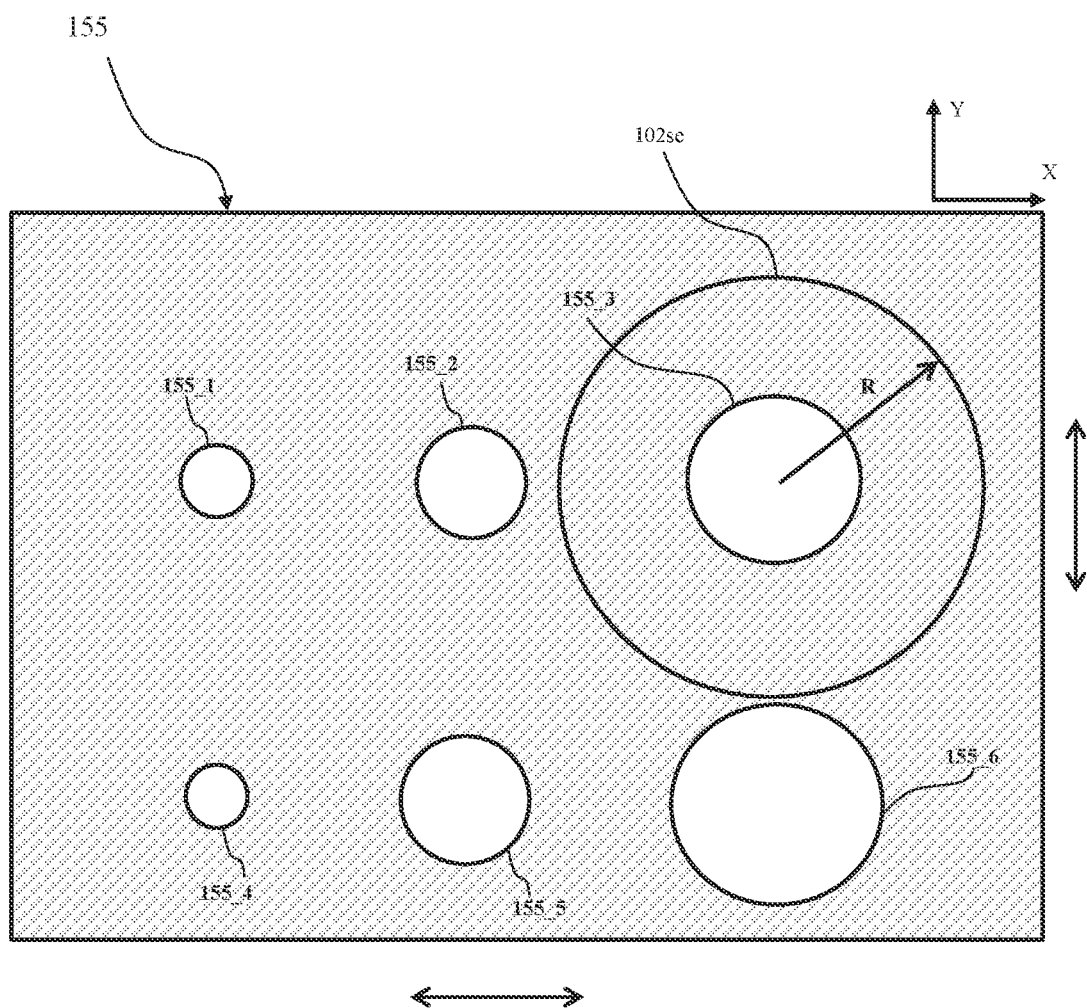
FIG. 4 is a schematic diagram illustrating an exemplary arrangement of apertures on an aperture array of secondary imaging system of FIG. 3, consistent with embodiments of the present disclosure.

Reference is now made to FIG. 4, which illustrates a schematic diagram of exemplary arrangement of apertures on secondary beam-limit aperture array 155, consistent with embodiments of the present disclosure. Although beam-limit aperture array 155 comprises six apertures of varying sizes are illustrated in FIG. 4, any number of apertures may be used.

As shown in FIG. 4, a cross-section 102se represents a cross-section of the overlapping secondary electron beams 102_1se-102_3se incident on secondary beam-limit aperture array 155. In some embodiments, secondary electron beams 102_1se-102_3se may not overlap at the same crossing plane to form a sharp secondary beam crossover, but instead may be offset along secondary optical axis 150_1 such that they form a range of crossing planes. In such cases, cross-section 102se of overlapping secondary electron beams 102_1se-102_3se may not be sharp.

In some embodiments, to minimize the occurrence of crosstalk, the distance between two adjacent apertures such as 155_2 and 155_3 may be larger than the sum of radius R of overlapped secondary electron beam 102se and a radius of the larger one of the two apertures. In some embodiments, secondary beam-limit aperture array 155 may comprise at least two apertures of equal size, and in such cases, the distance between two adjacent apertures such as 155_2 and 155_3 may be larger than the sum of radius R of cross-section 102se of overlapping secondary electron beams 102_1se-102_3se and a radius of the either one of the two apertures.

In some embodiments, radius R of cross-section 102se of overlapping secondary electron beams 102_1se-102_3se may depend on landing energies of primary beamlets or excitations of objective lens 131. Therefore, to accommodate a wide range of radii of overlapping secondary electron beams 102_1se-102_3se (represented by cross-section 102se of FIG. 4), the distance between two adjacent apertures may be determined based on the largest value of radius R.

In some embodiments, cross-section 102se includes secondary electrons generated by primary beamlets 102_1S~102_3S at a certain height, e.g., at the height of aperture array 155 as shown in FIG. 4. To block peripheral electrons, it is desirable to place the aperture hole at the height where R is at its minimum value, i.e., where secondary electrons have crossover. In some embodiments, radius R of cross-section 102se changes with energies of primary beamlets, excitations of objective lens 131, or the height where the secondary elections land on the aperture. As a result, radius R of cross-section 102Se can have minimum values at different heights along optical axis 150_1 (or the z axis). It is desirable to accommodate the variance in height while moving the aperture array in the x-y plane.

Figure 5:
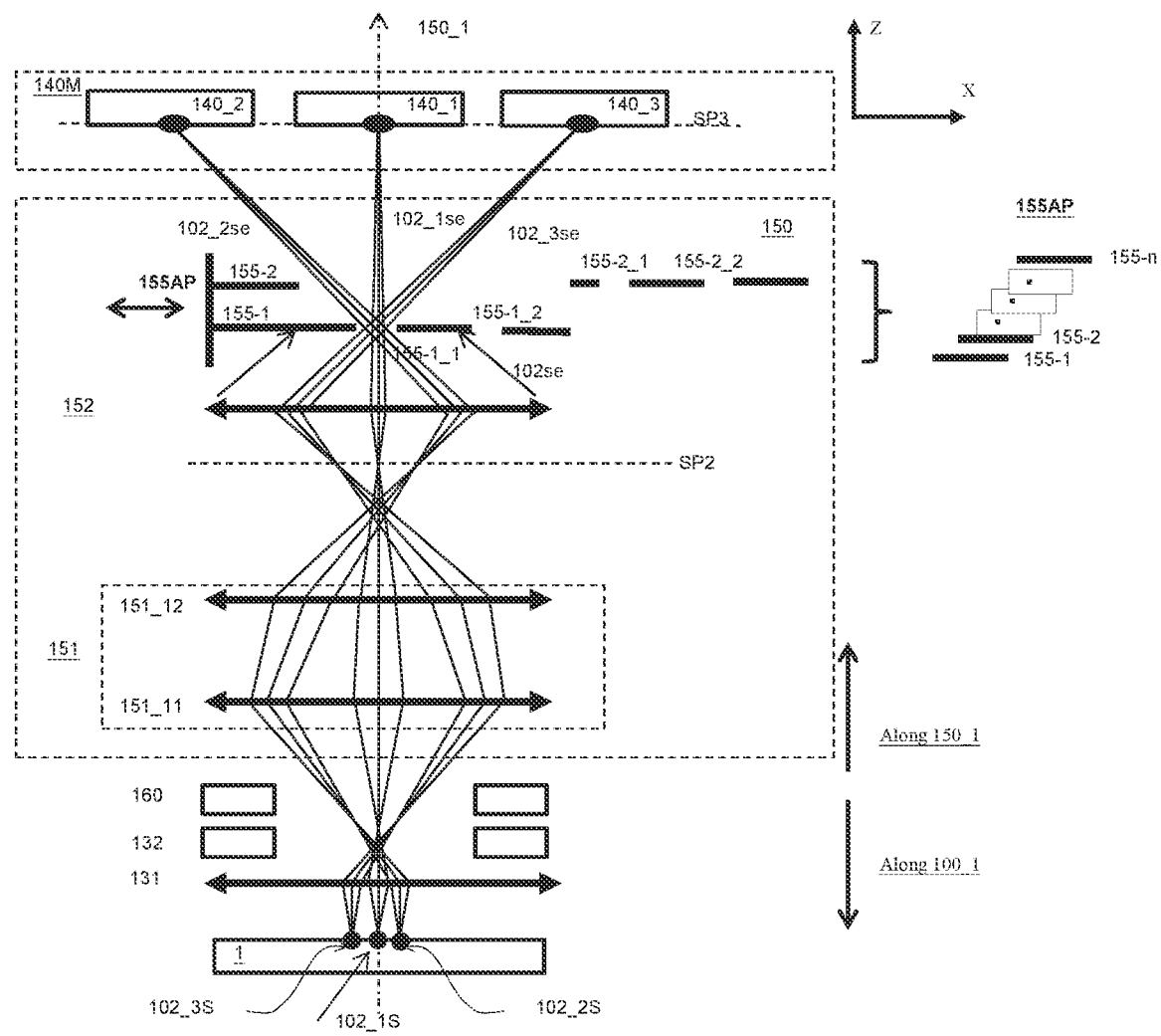
FIG. 5 is a schematic diagram illustrating an exemplary configuration of a secondary imaging system in a multi-beam apparatus, consistent with embodiments of the present disclosure.

Reference is now made to FIG. 5, which illustrates an exemplary configuration of a secondary imaging system 150 in an electron beam tool 500 of a multi-beam apparatus, consistent with embodiments of the present disclosure. In comparison to secondary imaging system 150 of electron beam tool 40 of FIG. 3, secondary imaging system 150 of electron beam tool 500 may include a secondary beam-limit aperture plate 155AP including multiple aperture arrays, e.g., 155-1 and 155-2, placed at different heights, so that secondary beam-limit aperture plate 155AP can provide aperture holes at different heights along the z axis, by moving in the x-y plane, to accommodate minimum radius R of 102se at corresponding heights along the z axis.

In some embodiments, to effectively block the peripheral electrons of different secondary beams 102_1se~102_3se, the apertures can be located on the plane where the crossover of 102_1se~102_3se is located. The crossover of 102_1se~102_3se can move along the z-axis at different heights in response to the change of the energies of primary beamlets or excitations of objective lens 131. As illustrated in FIG. 5, secondary beam-limit aperture plate 155AP comprises multiple aperture arrays (or multiple sets of apertures) 155-1 and 155-2 placed at different heights along the z axis. Each aperture array includes one or more apertures (or aperture holes), such as apertures 155-1_1 and 155-1_2 on aperture array 155-1, and apertures 155-2_1 and 155-2_2 on aperture array 155-2, configured to block peripheral electrons at different heights while allowing axial electrons of secondary electron beams 102_1se~102_3se. In some embodiments, by moving secondary beam-limit aperture plate 155AP integrated with multiple aperture arrays 155-1 and 155-2 together along the x axis or the y axis, at least one aperture hole at a suitable height along the z axis (secondary optical axis 150_1) can be used to mitigate cross-talk from peripheral secondary electron beams. In some embodiments, secondary beam-limit aperture plate 155AP only moves along the x axis or the y axis, but not along the z axis. As a result, fewer motors are required in the column of electron beam tool 500 to provide a simpler the structure with reduced the cost and improved accuracy of the system. In some embodiments, secondary beam-limit aperture plate 155AP can move along the x axis, the y axis, in a linear, circular, rectangular, or other polygon pattern, or along any other regular or irregular path in the x-y plane.

In some embodiments, as shown in FIG. 5, secondary beam-limit aperture plate 155AP can be aligned with secondary optical axis 150_1 such that aperture 155-1_1 on aperture array 155-1 blocks most of the peripheral electrons of off-axis secondary electron beams 102_2se and 102_3se. In some embodiments, when changes in landing energies of primary beamlets or excitations of objective lens 131 cause a change in the height or size of minimum radius R of cross-section 102se, secondary beam-limit aperture plate 155AP can be moved in the x-y plane to align another suitable aperture hole with the secondary optical axis while blocking crosstalk coming from other secondary electron beams. For example, by moving secondary beam-limit aperture plate 155AP in the x-y plane, without movement in the z axis, the suitable aperture hole located at a matching height, e.g., aperture 155-2_1, can be aligned with secondary optical axis 150_1 to accommodate the change in height or size of the cross-section 102se and block peripheral electrons of off-axis secondary electron beams 102_2se and 102_3se.

In some embodiments, multiple aperture arrays of secondary beam-limit aperture plate 155AP may be separated by a certain distance. In some embodiments, it may be desirable to minimize the distance between the multiple aperture arrays to have as many aperture arrays as possible and allow unrestricted movement of secondary beam-limit aperture plate 155AP, so as to reduce the possibility of peripheral secondary electrons escaping and illuminating other apertures of secondary beam-limit aperture array. Meanwhile, in some embodiments, the dimensions between the aperture arrays along the x axis or the y axis, or a total number of aperture arrays included in secondary beam-limit aperture plate 155AP, may be determined based on the dimensions of the column of electron beam tool 500.

In some embodiments, the arrangement of aperture arrays in secondary beam-limit aperture plate 155AP may be determined based on mechanical design considerations, available space, manufacturability, and cost-efficiency, among other things. For example, it may be possible, using some techniques, to reliably and reproducibly achieve a distance of 1 mm to 3 mm between adjacent aperture arrays of secondary beam-limit aperture plate 155AP. In some embodiments, other suitable distances may be selected based on factors including, but not limited to, space availability, design limitations, cost-efficiency, materials, and intended application.

For example, as shown in FIG. 5, secondary beam-limit aperture plate 155AP may comprise any suitable number of aperture arrays (155-1, 155-2 . . . 155-n) placed along the z axis. In some embodiments, a distance between the lowest aperture array and the highest aperture array is in a range from 5 mm to 20 mm. For example, a preferred distance between the lowest aperture array and the highest aperture array is about 10 mm. In some embodiments, the range of the distance between the lowest aperture array and the highest aperture array is related to a range of the landing energy of the primary electron beamlets. For example, the crossover position may move within a range of about 7 mm along the z axis, when the landing energy is in a range from about 0.5 keV to about 3 keV. In another example, the crossover position may move in a range of about 10 mm along the z axis, when the landing energy is in a range from about 0.3 keV to about 3 keV. In some embodiments, one or more other factors may also be considered in combination with or in addition to the landing energy of the primary electron beamlets, such as space availability, design limitations, cost-efficiency, materials, and intended application, etc. In some embodiments, a distance between adjacent aperture arrays placed along the z axis is in a range from about 0.5 mm to about 3 mm. For example, a preferred distance between adjacent aperture arrays is about 2 mm. In some embodiments, multiple aperture arrays may be staggered on secondary beam-limit aperture plate 155AP from the lowest height (e.g., 155-1) to the highest height (e.g., 155-n) along the x axis, the y axis, or any other suitable pattern (e.g., along a spiral pattern).

In some embodiments, choosing the number of aperture arrays contained in the secondary beam-limit aperture plate 155AP, designing the distance between adjacent aperture arrays, or designing the staggered arrangement of the aperture arrays can take into consideration the possible locations or heights where secondary electrons can have crossover (e.g., depending on the possible range of energies of primary beamlets or excitations of objective lens 131 of electron beam inspection system 100).

In some embodiments as shown in FIG. 5, crosstalk between secondary electron beams, e.g., 102_1se, 102_2se, and 102_3se, may be mitigated (e.g., cut off, or trimmed) by an aperture hole on a suitable aperture array at a certain height (e.g., aperture hole 155-1_1 on aperture array 155-1), while one or more other aperture arrays (e.g., 155-2) can pass, without interfering with, the secondary electron beams. In some embodiments not shown, the aperture holes on different aperture arrays at different heights of secondary beam-limit aperture plate 155AP may be arranged such that by moving secondary beam-limit aperture plate 150AP within the x-y plane, multiple aperture arrays can be used to mitigate the crosstalk between secondary electron beams at multiple heights simultaneously.

Reference is now made to FIGS. 6A-6D, which are schematic diagrams illustrating various exemplary arrangements of aperture arrays of secondary beam-limit aperture plate 155AP in secondary imaging system 150 of electron beam tool 500 shown in FIG. 5, consistent with embodiments of the present disclosure. It is appreciated that the sizes or shapes of apertures, sizes or shapes of aperture arrays 155-1, 155-2 . . . , sizes or shapes of secondary beam-limit aperture plate 155AP are for illustrative purposes only and not drawn to scale.

Figure 6A:
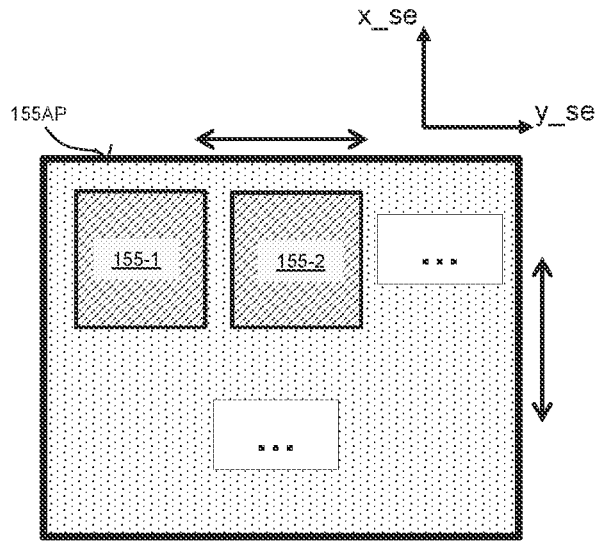
FIGS. 6A-6D are schematic diagrams illustrating exemplary arrangement of aperture arrays in a secondary beam-limit aperture plate of secondary imaging system of FIG. 5, consistent with embodiments of the present disclosure.
Figure 6B:
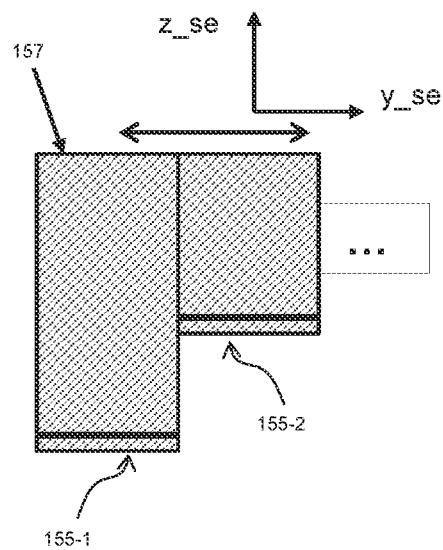
Figure 6C:
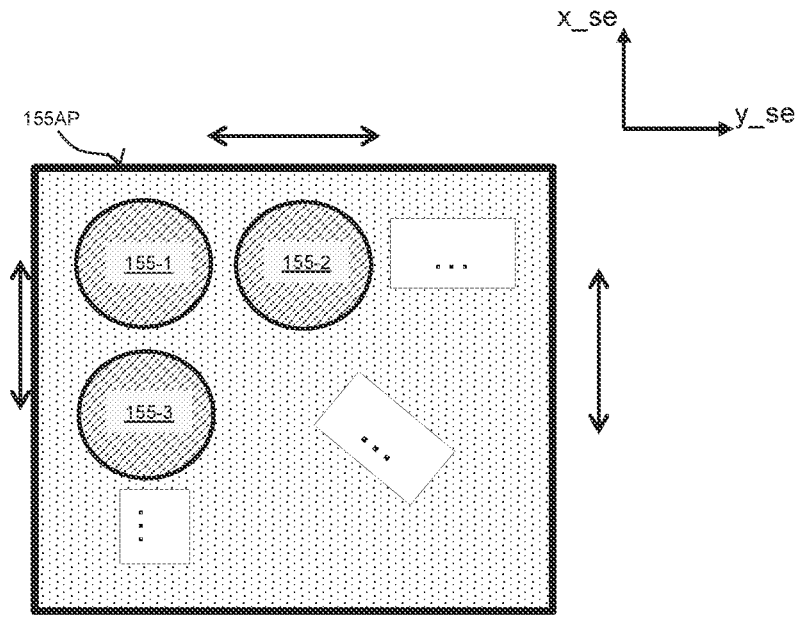
Figure 6D:
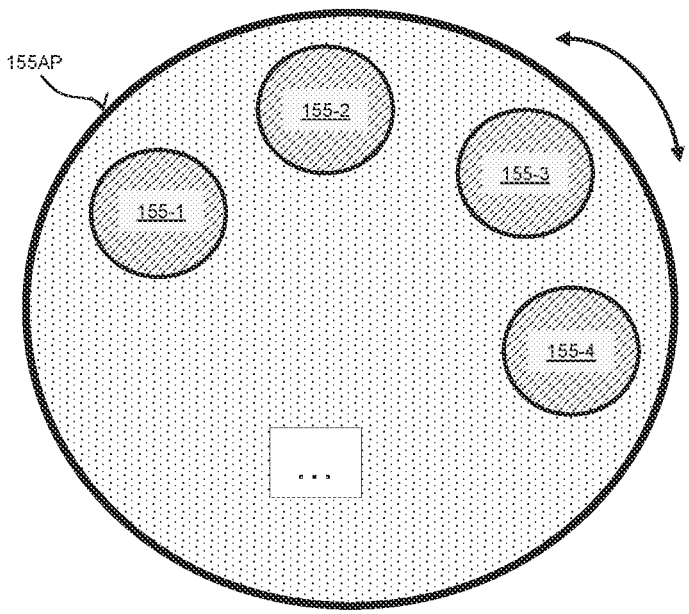

FIGS. 6A-6B illustrate a top view and a side view of a secondary beam-limit aperture plate 155AP comprising a plurality of aperture arrays, 155-1, 155-2, . . . aligned along an axis, for example, the y axis, while being placed at different heights along a different axis, e.g., the z axis. In some embodiments, viewing from the top view, a plurality of sets of apertures, e.g., a plurality of aperture arrays, can be aligned along the x axis, a diagonal line, or other suitable one-dimensional pattern. In some embodiments, viewing from the top view, the plurality of sets of apertures are arranged in a two-dimensional pattern in the x-y plane, such as a rectangular, a circular, a square, an eclipse, a spiral, etc., while being positioned at different heights along the z axis. In some embodiments, beam-limit aperture plate 155AP has a surface, e.g., surface 157 of FIG. 6B, that is substantially perpendicular to optical axis 150_1 (e.g., substantially parallel to the z axis). In some embodiments, beam-limit aperture plate 155AP comprises a first aperture, e.g., aperture 155-1_1 on a first aperture array 155-1, at a first distance relative to the surface, e.g., surface 157 of FIG. 6B, of beam-limit aperture plate 155AP along optical axis 150_1. In some embodiments, beam-limit aperture plate 155AP comprises a second aperture, e.g., aperture 155-2_1 on a second aperture array 155-2, at a second distance relative to the surface, e.g., surface 157 of FIG. 6B, of beam-limit aperture plate 155AP along optical axis 150_1. In some embodiments, the first distance is different from the second distance. As such, the first aperture is located at a different height from the second aperture. Although only two apertures are shown, any number of apertures may be used. FIGS. 6C-6D illustrate top views of secondary beam-limit aperture plates 155AP comprising aperture arrays, 155-1, 155-2, . . . in circular shapes and aligned in various arrangements. In one example, the multiple aperture arrays 155-1, 155-2, 155-3, . . . are aligned along the x axis or the y axis as shown in FIG. 6C. In another example, the multiple aperture arrays 155-1, 155-2, 155-3, 155-4, . . . are aligned in a circular pattern as shown in FIG. 6D. Although not shown, secondary beam-limit aperture plate 155AP can also have aperture arrays in different shapes or sizes. For example, secondary beam-limit aperture plate may include a combination of square, rectangular, and circular shaped aperture arrays. In another example, secondary beam-limit aperture plate may include aperture arrays with different sizes including different number of aperture holes on respective aperture arrays.

In some embodiments, the number of aperture arrays included in any of these configurations may be limited by the allowable dimensions of secondary beam-limit aperture plate 155AP based on physical space available in secondary imaging system 150. In some embodiments, secondary beam-limit aperture plate 155AP may be configured to move along a single axis such as the x axis or the y axis, or both the x and y axes, or rotate along a certain direction (e.g., clockwise or counter-clockwise in FIG. 6D), to select a desired size or shape, or at a desired location (e.g., height) along the z axis, of the aperture hole included in a suitable aperture array through which overlapping secondary electron beam may pass (e.g., to match the position of secondary beam crossover plane). In some embodiments, secondary beam-limit aperture plate 155AP may not move along the z axis. As illustrated herein, the x and y axes may be perpendicular to secondary optical axis 150_1 and the z axis may be parallel to secondary optical axis 150_1.

In some embodiments, the position of secondary beam crossover plane along secondary optical axis 150_1 may be determined based at least on factors including, but not limited to, landing energies of primary beamlets, and excitation of objective lens 131. In some embodiments, the corresponding positions of secondary beam crossover plane for a range of landing energies of primary beamlets may be determined based on simulations and data modeling algorithms. In some embodiments, the position of the secondary beam crossover plane may be determined by controller 50, and controlling signals may be generated by controller 50 and sent to electron beam tool 500 for controlling motors to move and adjusting position of secondary beam-limit aperture plate 155AP.

Based on the landing energies of the primary beamlets, the secondary electron beams may overlap at different planes perpendicular to secondary optical axis 150_1, thus forming a range of secondary beam crossover plane positions (e.g., along the z axis) for a corresponding range of landing energies. In some embodiments, the crossover plane positions may be determined based on a simulation of landing energies, and therefore, the range of secondary beam crossover plane positions may be determined based on the range of landing energies used in the system. For example, a user or the system may determine, based on simulation, such as an algorithm, the coordinates of the secondary beam crossover plane for a given value of landing energies of the primary beamlets.

In some embodiments, charged-particle beam inspection system (e.g., electron beam inspection system 100 of FIG. 1) may comprise a movable secondary beam-limit aperture plate 155AP configured to move (e.g., along the x or the y axis) according to the determined position of the secondary beam crossover plane, to select the aperture hole on a suitable aperture array. In some embodiments, by moving the movable secondary beam-limit aperture plate 155AP, one or more aperture arrays with suitable aperture holes may be placed within the range of crossover positions along secondary optical axis 150_1 (or the z axis) to effectively block peripheral electrons and reduce the possibility of crosstalk.

Figure 7A:
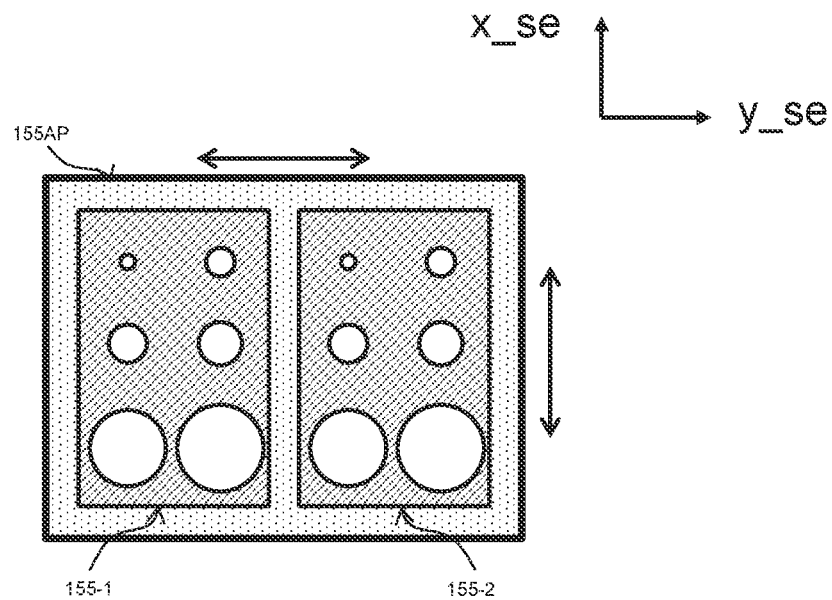
FIGS. 7A-7B are schematic diagrams illustrating an exemplary arrangement of apertures of aperture arrays in a secondary beam-limit aperture plate of secondary imaging system of FIG. 5, consistent with embodiments of the present disclosure.
Figure 7B:
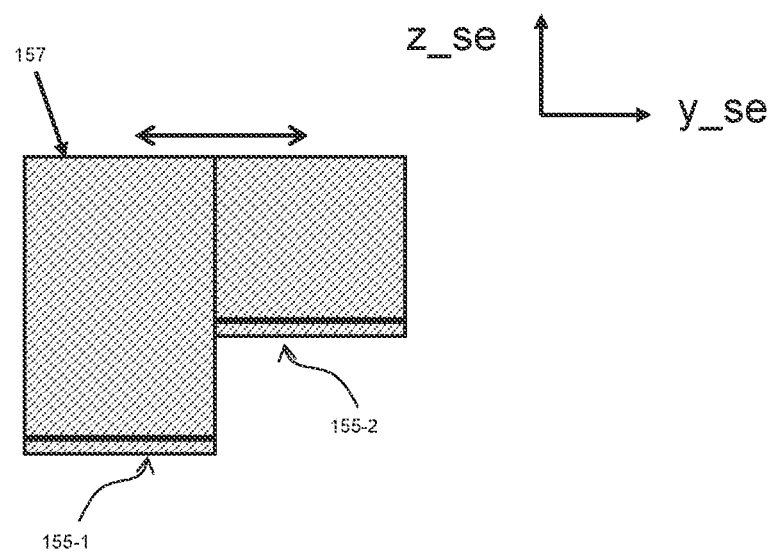

Reference is now made to FIGS. 7A-7B, which illustrates a top view and a side view of an exemplary secondary beam-limit aperture plate 155AP of a secondary imaging system 150 in an electron beam tool 500 of a multi-beam apparatus, consistent with embodiments of the present disclosure. In some embodiments, secondary beam-limit aperture plate 155AP includes a plurality of aperture arrays, e.g., 155-1 and 155-2, that are arranged along an axis (e.g., the y axis or the x axis) perpendicular to the secondary optical axis 150_1, and at different heights along another axis (e.g., the z axis) parallel to the secondary optical axis. In some embodiments, a respective aperture array includes a plurality of aperture holes with different sizes arranged in any suitable pattern. Although not shown, the aperture holes may have uniform size within the same aperture array.

To block peripheral electrons of secondary beams 102_1se~102_3se, the aperture holes are placed on the plane where the crossover of 102_1se~102_3se is located. In some embodiments, as discussed herein, the crossover of electrons of secondary beams 102_1se~102_3se can move along the z axis when energies of primary beamlets and excitations of objective lens 131 change. Accordingly, by moving aperture arrays 155-1 and 155-2 together on secondary beam-limit aperture plate 155AP along the x axis or the y axis, an aperture hole of a suitable aperture array can appear at a desirable height (e.g., the z value), without moving parts in the third direction along the z axis. That is, by moving secondary beam-limit aperture plate 155AP along the x axis or the y axis, the secondary electrons can crossover at a suitable aperture array, e.g., 155-1 or 155-2, at different z values. In some embodiments not shown, aperture arrays or aperture holes on a respective array of secondary beam-limit aperture plate 155A may be uniform in size, shape, cross-section, and pitch.

Figure 8A:
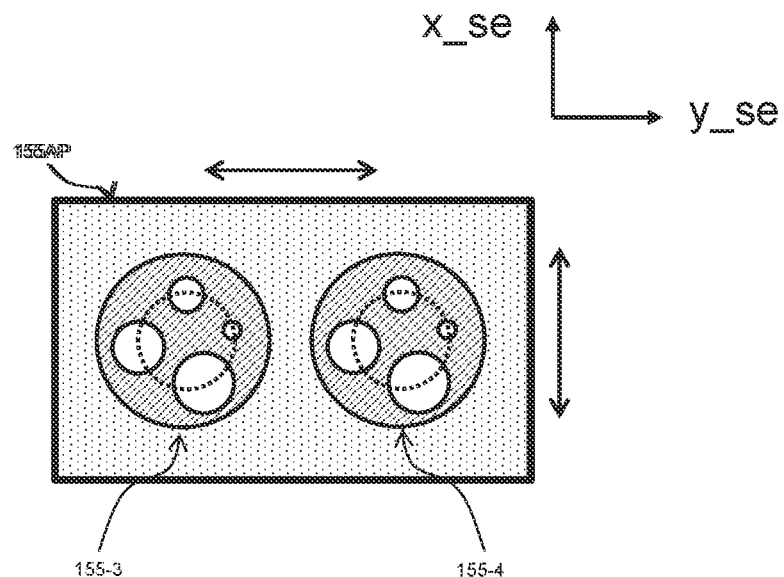
FIGS. 8A-8B are schematic diagrams illustrating an exemplary arrangement of apertures of aperture arrays in a secondary beam-limit aperture plate of secondary imaging system of FIG. 5, consistent with embodiments of the present disclosure.
Figure 8B:
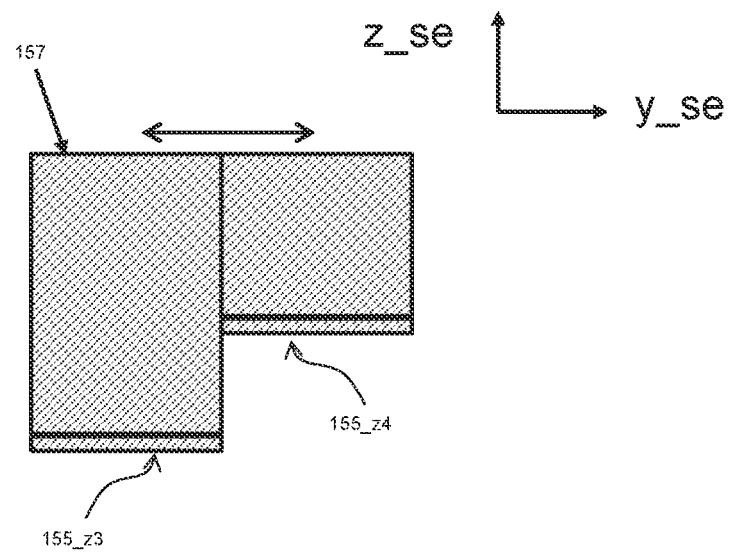

Reference is now made to FIGS. 8A-8B, which illustrates a top view and a side view of an exemplary secondary beam-limit aperture plate 155AP of a secondary imaging system 150 in an electron beam tool 500 of a multi-beam apparatus, consistent with embodiments of the present disclosure. In some embodiments, secondary beam-limit aperture plate 155AP includes a plurality of aperture arrays, e.g., 155-3 and 155-4, that are in circular shape, and arranged along the x axis or the y axis and at different heights along the z axis. In some embodiments, as shown in FIG. 8A, the aperture holes on an aperture array are in circular shape, with different sizes, and distributed in a circular pattern. By moving secondary beam-limit aperture plate 155AP along the x axis or the y axis, the secondary electrons can crossover at a suitable aperture array, e.g., 155-3 or 155-4, at different z values.

Figure 9A:
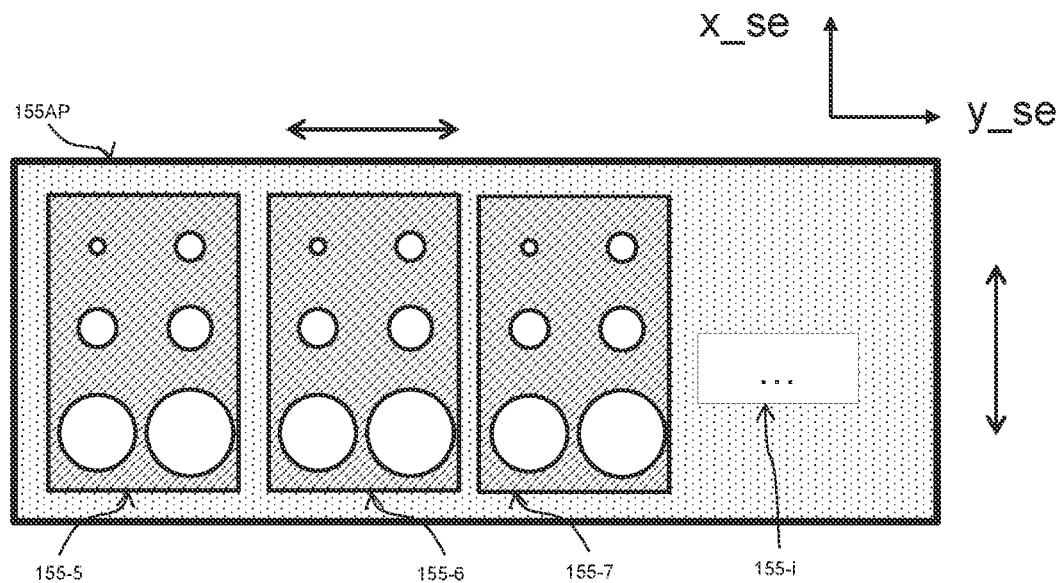
FIGS. 9A-9B are schematic diagrams illustrating an exemplary arrangement of apertures of aperture arrays in a secondary beam-limit aperture plate of secondary imaging system of FIG. 5, consistent with embodiments of the present disclosure.
Figure 9B:
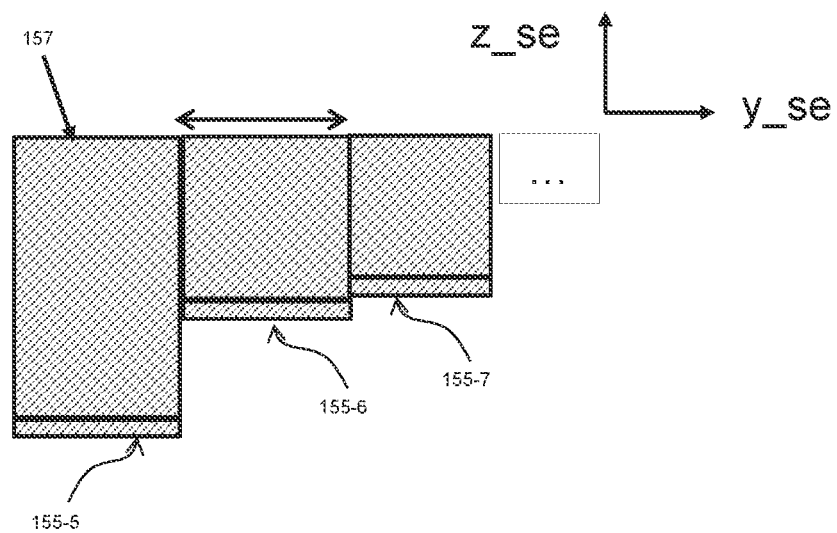

Reference is now made to FIGS. 9A-9B, which illustrates a top view and a side view of an exemplary secondary beam-limit aperture plate 155AP of a secondary imaging system 150 in an electron beam tool 500 of a multi-beam apparatus, consistent with embodiments of the present disclosure. In some embodiments, secondary beam-limit aperture plate 155AP includes any suitable number of aperture arrays, e.g., 155-5, 155-6, 155-7, . . . 155-i, that are in any suitable shape, such as a circular shape, arranged along the x axis or the y axis and at different heights along the zis. By moving secondary beam-limit aperture plate 155AP along the x axis or the y axis, the secondary electrons can crossover at a suitable aperture array, e.g., 155-5, 155-6, or 155-7, at different z values.

In some embodiments, an aperture array on secondary beam-limit aperture plate 155AP comprises any suitable number of aperture holes, placed in any suitable pattern, such as a rectangular matrix along the x and y axes (e.g., FIGS. 7A, 9A), or a circular pattern (e.g., FIG. 8A). In some embodiments, the aperture array on secondary beam-limit aperture plate 155AP may comprise aperture holes of different sizes (e.g., FIGS. 7A, 8A, 9A). In some embodiments, an aperture array may comprise at least two aperture holes of similar size. In some embodiments, aperture holes may be placed on an aperture array with sizes decreasing along a certain direction, e.g., the x axis or the y axis. Aperture holes can also be arranged with sizes distributed in an alternative pattern so as to fit more aperture holes within a more compact structure.

In some embodiments, secondary beam-limit aperture plate 155AP may be configured to move along both, the x and y axes, to select an aperture hole with the suitable size and at the suitable height for letting overlapping secondary electron beam pass through. Although FIGS. 7A, 8A, and 9A illustrate rectangular secondary beam-limit aperture plate (e.g., secondary beam-limit aperture plate 155AP), other shapes including, but not limited to, circular, triangular, elliptical, etc. may be used. It is appreciated that the size and the shape of secondary beam-limit aperture plate may be determined based on physical space available, mechanical design considerations, cost-efficiency, etc.

Figure 10:
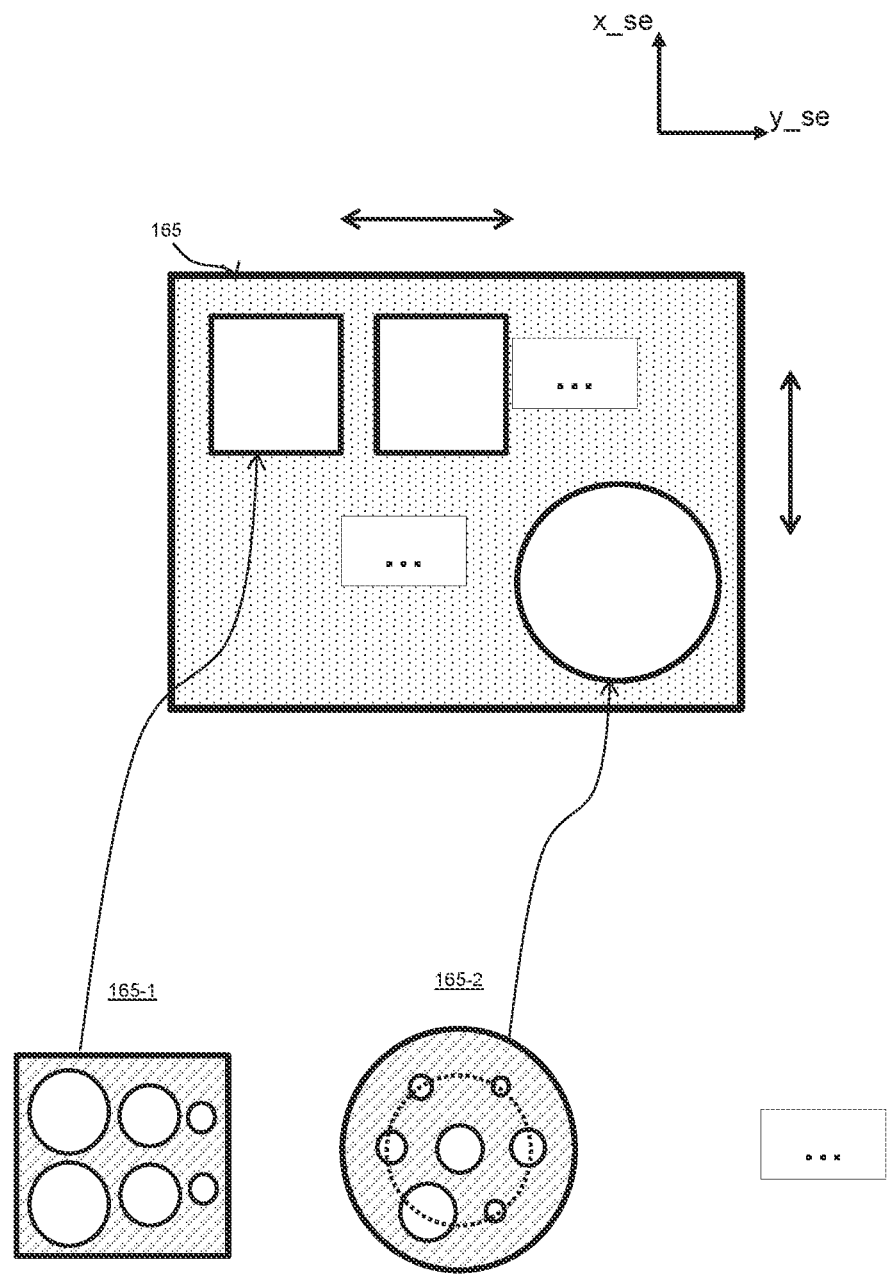
FIG. 10 is a schematic diagram illustrating an exemplary secondary beam-limit aperture plate template comprising a plurality of slots for removably containing replaceable secondary beam-limit aperture arrays for use in a secondary imaging system of FIG. 5, consistent with embodiments of the present disclosure.

Reference is now made to FIG. 10, which illustrates a secondary beam-limit aperture plate template 165 comprising a plurality of slots for removably containing suitable replaceable secondary beam-limit aperture arrays (also "replaceable aperture array"), e.g., 165-1, 165-2 . . . respectively to be used in a secondary imaging system 150 in an electron beam tool 500 of a multi-beam apparatus, consistent with embodiments of the present disclosure. In some embodiments, secondary beam-limit aperture plate template 165 can include any suitable number of slots distributed along the x-y direction in any suitable pattern. Similar to FIGS. 6B, 7B, 8B, and 9B, the plurality of slots are placed at different heights along the z axis for inserting aperture arrays containing aperture holes at different heights to accommodate the change of secondary beam crossover plane. In some embodiments, the plurality of slots have different sizes or shapes. In some embodiments, the plurality of slots have uniform size or shape.

In some embodiments, replaceable aperture array 165-1 includes a plurality of aperture holes placed in a rectangular matrix along the x and y axes. In some embodiments, replaceable aperture array 165-1 may comprise apertures of different sizes. In some embodiments, replaceable aperture array 165-1 may comprise at least two apertures of similar size. In some embodiments, replaceable aperture array 165-2 includes a plurality of aperture holes, e.g., seven aperture holes, including a center aperture hole and six off-center apertures arranged radially around the center aperture. As illustrated in FIG. 10, off-center apertures may be positioned along a virtual circle (in dash line) so that the separation distance between the center of center aperture and the center of each of the off-center apertures may be uniform. In other words, the separation distance between the center of center aperture and the center of each of the off-center apertures may be similar or substantially similar to the radius of circle. As illustrated in FIG. 10, replaceable aperture array 165-2 may comprise apertures of different sizes. The center aperture may be different in size compared to off-center apertures. In some embodiments, each of the off-center apertures may be of different sizes, randomly arranged in size along the perimeter of virtual circle. In some embodiments, two or more aperture holes of replaceable aperture array, e.g., 165-1, 165-2, may be similar or substantially similar in size.

In some embodiments, after inserting suitable replaceable aperture arrays, secondary beam-limit aperture plate 165 may be configured to move along the x axis or the y axis, or both the x and y axes, to select an aperture hole with a suitable size at a suitable height (z value) through which overlapping secondary electron beam may pass. One of the several advantages of a circular arrangement of apertures in replaceable aperture array 165 is that a variety of aperture sizes may be accessed with limited movement in the x axis or the y axis.

In some embodiments, the design of secondary beam-limit aperture plate template 165 as illustrated in FIG. 10 can provide a flexible, customizable, and adjustable secondary beam-limit aperture plate by allowing the user to select and removably insert one or more replaceable aperture arrays, e.g., 165-1, 165-2 . . . , to better fit the user's needs or the system requirement.

In some embodiments, aperture arrays or aperture holes may be contaminated after long periods of use, for example due to particles, debris, and gas generated by secondary electrons incident on secondary beam-limit aperture plate or array. The contamination may change the effective size or shape of the aperture, affecting the collection efficiency of detection elements (e.g., 140_1, 1402, and 140_3 of FIG. 3) of electron detection device 140, and therefore impacting the overall throughput and resolution of images. Further, the size and shape of the apertures on aperture arrays of secondary beam-limit aperture plate may vary over time based on the duration of usage, materials, inspection parameters, etc. For example, exposure to secondary electrons may cause contamination and debris formation on the edges of an aperture, thus reducing the effective size and shape of the aperture through which secondary electrons may pass.

In some embodiments as illustrated in FIG. 10, a user may replace the degraded or damaged aperture array with a new one on secondary beam-limit aperture plate template 165. One of the advantages of having replaceable aperture arrays swappable on secondary beam-limit aperture plate template 165, or having two or more apertures of similar sizes on one aperture array, may include reduction in tool down-time due to maintenance. For example, if one aperture array is damaged or one of the apertures is contaminated, a replaceable aperture array or a second aperture of similar size may be used, allowing uninterrupted tool usage and resultantly improving overall throughput of wafer inspection.

Reference is now made to FIG. 11, which illustrates a process flowchart representing an exemplary method 1100 of controlling a beam-limit aperture plate (e.g., beam-limit aperture plate 155AP of FIGS. 5, 6A-6D, 7A-7B, 8A-8B, and 9A-9B, or beam-limit aperture plate 165 with inserted aperture arrays of FIG. 10) of a secondary imaging system of FIG. 5 to form images of a sample, consistent with embodiments of the present disclosure. In some embodiments, method 110 can be performed by a secondary imaging system (e.g., secondary imaging system 150 of FIG. 5), a controller coupled to the secondary imaging system (e.g., controller 50 of EBI system 100 of FIG. 1), or a computing device communicatively coupled to the secondary imaging system. For example, controller 50 may be programmed to implement one or more steps of method 1100. For example, controller 50 may instruct a module of a charged particle beam apparatus to activate a charged-particle source to generate charged particle beams, which upon interaction with the sample may generate secondary charged-particle beams. In some embodiments, the beam-limit aperture plate is configured to be positioned substantially perpendicular to an optical axis. In some embodiments, the beam-limit aperture plate includes a first aperture (e.g., aperture 155-1_1 of aperture array 155-1) at a first distance relative to a surface of the beam-limit aperture plate along a first axis (e.g., the z axis, or the optical axis such as secondary optical axis 150_1), and a second aperture (e.g., aperture 155-2_1 of aperture array 155-2) at a second distance relative to the surface of the beam-limit aperture plate along the optical axis. The second distance is different from the first distance. In some embodiments, the first and second apertures have a same diameter.

In step 1110, a position of a crossover plane associated with a plurality of secondary electron beams (e.g., 102_1se, 102_2se, 102_3se of FIG. 5) may be determined. As discussed herein, in some embodiments, the position of secondary beam crossover plane may depend on landing energies of primary beamlets or excitations of objective lens 131, among other things. In some embodiments, multiple secondary electron beams (e.g., 102_1se, 102_2se, 102_3se of FIG. 5) may be generated from the sample (e.g., sample 1) upon interaction of primary beamlets (e.g., 102_1, 102_2, and 102_3 of FIG. 2) with probe spots (e.g., 102_1S, 102_2S, and 102_3S of FIG. 2) of the sample. In some embodiments, the number of secondary electron beams generated may be equal to the number of primary beamlets incident on the sample. The three secondary electron beams 102_1se, 102_2se and 102_3se may be diverted by a beam separator such as a Wien Filter (e.g., beam separator 160 of FIG. 2) to enter secondary imaging system 150 along secondary optical axis 150_1 thereof.

In some embodiments, the secondary electron beams 102_1se~102_3se can be directed such that they overlap at a common area of crossing along the secondary optical axis and therefore form a secondary beam crossover (e.g., such as a relatively sharp secondary beam crossover). The plane where the common area of crossing or secondary beam crossover is located is referred to as a crossing plane or secondary beam crossover plane. A beam-limiting aperture plate (e.g., secondary beam-limit aperture plate 155AP of FIG. 5) including a plurality aperture arrays (e.g., 155-1, 155-2 . . . 155-n, FIG. 5) may be positioned at or near the secondary beam crossover plane. For example, the plurality of aperture arrays (e.g., multiple sets of apertures) may be placed on or within a range of positions of the crossover plane and perpendicular to the secondary optical axis.

In step 1120, a location can be determined for moving the beam-limit aperture plate to position one of a plurality of apertures of the beam-limit aperture plate in the crossover plane to cause the one of the plurality of apertures to align with the plurality of secondary charged-particle beams. In some embodiments, the beam-limit aperture plate has a surface (e.g., surface 157) positioned substantially perpendicular to an optical axis (e.g., axis 150_1). The beam-limit aperture plate comprises a first aperture (e.g., 155-1_1) at a first distance relative to the surface of the beam-limit aperture plate, and a second aperture (e.g., 155-2_1) at a second distance relative to the surface of the beam-limit aperture plate. The second distance is different from the first distance. In some embodiments, a change of the position of the crossover plane associated with the plurality of secondary charged-particle beams can be determined based on a change of a landing energy of the plurality of primary charged-particle beams on the sample or excitations of objective lens (e.g., objective lens 131).

In step 1130, the beam-limit aperture plate can be moved, according to the determined location (from step 1120), along a second axis (e.g., the x axis, the y axis, or a direction in the x-y plane) different from the optical axis (e.g., parallel to the z axis) to position the one of the plurality of apertures to be aligned with the plurality of secondary charged-particle beams that overlap to form the crossover plane. In some embodiments, the beam-limit aperture plate may be moved along the second axis to switch from the first aperture being aligned with the secondary charged-particle beams that form the crossover plane at the first distance (e.g., a first height along the optical axis), to the second aperture being aligned with the secondary charged-particle beams that form the crossover plane at the second distance (e.g., a second height different from the first height along the optical axis). In some embodiments, the beam-limit aperture plate is moved along the second axis (e.g., the x axis or the y axis) or in a plane (e.g., the x-y plane) substantially perpendicular to the optical axis (e.g., the z axis). In some embodiments, the beam-limit aperture plate is not movable along the optical axis. For example, the beam-limit aperture cannot be moved, or is not movable, along the z axis (e.g., a direction substantially parallel to the secondary optical axis). In some embodiments, the beam-limit aperture plate is moved linearly along the x axis or the y axis, or in any suitable pattern in the x-y plane. For example, the beam-limit aperture plate can be moved in a rotational movement in the x-y plane.

In some embodiments, the secondary electron beams may be trimmed using the secondary beam-limit aperture plate, e.g., via a first aperture array including one or more apertures (such as aperture 155-1_1 of aperture array 155-1, FIG. 5), placed at a first location along a first direction (e.g., along the z axis or the secondary optical axis 150_1). The first aperture array of the secondary beam-limit aperture plate may be placed at or within a moving range of positions of the secondary beam crossover plane. The first aperture array may include one or more apertures with suitable size or position that can be used to block off peripheral secondary electrons directed towards charged-particle detection elements (e.g., electron detection device 140 of FIG. 5). The position of secondary beam crossover plane may depend on landing energy of primary beamlets or excitations of objective lens (e.g., objective lens 131 of FIG. 2), among other things. The first aperture array of the secondary beam-limit aperture array may be placed at an optimal position within a secondary beam crossover plane moving range.

In some embodiments, after moving the beam-limit aperture plate, the secondary electron beams may be further trimmed using the beam-limit aperture plate, e.g., via a second aperture array including one or more apertures (such as aperture 155-2_1 of aperture array 155-2, FIG. 5), placed at a second location along the first direction (e.g., along the z axis or the secondary optical axis 150_1). The second aperture array of the secondary beam-limit aperture plate may be placed at or within a moving range of positions of the secondary beam crossover plane. The second location of the second aperture array is different from the first location of the first aperture array along the first direction, e.g., along the z axis. The secondary beam-limit aperture plate may be moved along the x-y plane such that the desired aperture or aperture size contained in the second aperture array may be used to block off peripheral secondary electrons directed towards charged-particle detection elements (e.g., electron detection device 140 of FIG. 5). In some embodiments, a change of the position of secondary beam crossover plane may be caused by a change in landing energy of primary beamlets or excitations of objective lens (e.g., objective lens 131 of FIG. 2), among other things. Accordingly, secondary beam-limit aperture plate may be placed at an updated position, with the second aperture array placed within the updated secondary beam crossover plane, in response to such change. It is appreciated that other combinations of the number of aperture arrays and their arrangements on secondary beam-limit aperture plate may be used, as desired.

In some embodiments, controller 50 (FIG. 1) may determine the location of a crossover plane associated with the plurality of secondary charged-particle beams based on a landing energy of the plurality of primary charged-particle beams on the sample, or excitations of objective lens. In some embodiments, controller 50 may generate instructions that cause to place at least one aperture of the beam-limit aperture plate at the determined location within the crossover plane. In some embodiments, controller 50 may generate instructions that move the beam-limit aperture plate to switch from aligning the first set of one or more apertures (e.g., aperture array 155-1) at the first location with the crossover plane to aligning the second set of one or more apertures (e.g., aperture array 155-2) at the second location with the updated crossover plane, in accordance with a change of the location of the crossover plane along the first direction (e.g., the z axis) caused by a change of the landing energy of the plurality of primary charged-particle beams. In some embodiments, a recommendation may also be generated for moving the beam-limit aperture plate to align at least one aperture in response to the change of the location of the crossover plane. In some embodiments, the beam-limit aperture plate is movable within a plane (e.g., the x-y plane) substantially perpendicular to the first direction (e.g., the z axis). In some embodiments, the beam-limit aperture plate is not movable along the first direction (e.g., the z axis).

In some embodiments, the trimmed secondary electron beams may be projected towards the detection elements (e.g., 140_1, 1402, and 140_3 of FIG. 5) of the electron detection device to produce images of the probed regions of the sample.

A non-transitory computer readable medium may be provided that stores instructions for a processor of a controller (e.g., controller 50 of FIG. 1) to carry out image inspection, image acquisition, condenser lens adjusting, activating charged-particle source, beam deflecting, positioning and moving of beam-limit aperture array (e.g., secondary beam-limit aperture array 155AP), etc. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The embodiments may further be described using the following clauses:

1. An electro-optical system comprising:
 a beam-limit aperture plate having a surface that is substantially perpendicular to an optical axis, the beam-limit aperture plate comprising:
  a first aperture at a first distance relative to the surface of the beam-limit aperture plate; and
  a second aperture at a second distance relative to the surface of the beam-limit aperture plate, wherein the second distance is different from the first distance.

2. The electro-optical system of clause 1, wherein the first aperture is a part of a first set of apertures of the beam-limit aperture plate at the first distance.

3. The electro-optical system of any one of clauses 1-2, wherein the second aperture is a part of a second set of apertures of the beam-limit aperture plate at the second distance.

4. The electro-optical system of any one of clauses 1-3, further comprising a charged-particle detector including a plurality of detection elements, wherein a respective detection element of the plurality of detection elements is associated with a corresponding beam of a plurality of secondary charged-particle beams.

5. The electro-optical system of any one of clauses 1-4, wherein a distance between the first distance and the second distance is 10 mm or less.

6. The electro-optical system of any one of clauses 1-5, wherein the plurality of secondary charged-particle beams comprises at least one of secondary electrons or back-scattered electrons generated from the sample in response to an interaction between a plurality of primary charged-particle beams and the sample.

7. The electro-optical system of clause 2, wherein at least two apertures of the first set of apertures have different sizes.

8. The electro-optical system of clause 7, wherein the plurality of apertures of the first set are arranged in a linear, a rectangular, a circular, or a spiral pattern.

9. The electro-optical system of clause 3, wherein at least two apertures of the second set of apertures have different sizes.

10. The electro-optical system of clause 9, wherein the plurality of apertures of the second set are arranged in a linear, a rectangular, a circular, or a spiral pattern.

11. The electro-optical system of any one of clauses 1-10, wherein the optical axis is a secondary optical axis of the electro-optical system.

12. The electro-optical system of any one of clauses 1-11, wherein the first aperture is placed away from the second aperture along a second axis perpendicular to the optical axis.

13. The electro-optical system of any one of clauses 4-12, wherein the plurality of secondary charged-particle beams overlap to create a crossover area on a crossover plane perpendicular to the optical axis of the electro-optical system.

14. The electro-optical system of any one of clauses 1-13, wherein the first aperture and the second aperture of the beam-limit aperture plate are located on or within a range of positions of a crossover plane perpendicular to the optical axis.

15. The electro-optical system of clause 14, wherein the range of positions of the crossover plane is determined based on a landing energy of the plurality of primary charged-particle beams on the sample or an excitation of objective lens.

16. The electro-optical system of any one of clauses 1-15, wherein the beam-limit aperture plate is movable along a second axis perpendicular to the optical axis.

17. The electro-optical system of any one of clauses 1-16, wherein the beam-limit aperture plate is not movable along the optical axis.

18. The electro-optical system of any one of clauses 1-16, wherein the beam-limit aperture plate is configured to move along a second axis perpendicular to the optical axis to position the first aperture at a first position and the second aperture at a second position, wherein the first aperture is aligned with the plurality of secondary charged-particle beams that overlap to form a first crossover plane at the first distance, wherein the second aperture is aligned with the plurality of secondary charged-particle beams that overlap to form a second crossover plane at the second distance, and wherein the first and second crossover planes are substantially perpendicular to the optical axis.

19. The electro-optical system of any one of clauses 1-18, wherein the first aperture and the second aperture have different sizes.

20. A multi charged-particle beam apparatus comprising:
an electro-optical system for projecting a plurality of secondary charged-particle beams from a sample onto a charged-particle detector, the electro-optical system comprising a beam-limit aperture plate having a surface that is substantially perpendicular to an optical axis, the beam-limit aperture plate comprising:
  a first aperture at a first distance relative to the surface of the beam-limit aperture plate; and
  a second aperture at a second distance relative to the surface of the beam-limit aperture plate, wherein the second distance is different from the first distance,
  wherein the charged-particle detector includes a plurality of detection elements, a respective detection element of the plurality of detection elements being associated with a corresponding beam of a plurality of secondary charged-particle beams.

21. The multi charged-particle beam apparatus of clause 20, wherein the first aperture is a part of a first set of apertures of the beam-limit aperture plate at the first distance.

22. The multi charged-particle beam apparatus of any one of clauses 20-21, wherein the second aperture is a part of a second set of apertures of the beam-limit aperture plate at the second distance.

23. The multi charged-particle beam apparatus of any one of clauses 20-22, wherein a distance between the first distance and the second distance is 10 mm or less.

24. The multi charged-particle beam apparatus of any one of clauses 20-23, wherein the plurality of secondary charged-particle beams comprises at least one of secondary electrons or back-scattered electrons generated from the sample in response to an interaction between a plurality of primary charged-particle beams and the sample.

25. The multi charged-particle beam apparatus of any one of clauses 21-24, wherein at least two apertures of the first set of apertures have different sizes.

26. The multi charged-particle beam apparatus of any one of clauses 21-25, wherein the plurality of apertures of the first set are arranged in a linear, a rectangular, a circular, or a spiral pattern.

27. The multi charged-particle beam apparatus of any one of clauses 22-26, wherein at least two apertures of the second set of apertures have different sizes.

28. The multi charged-particle beam apparatus of any one of clauses 22-27, wherein the plurality of apertures of the second set are arranged in a linear, a rectangular, a circular, or a spiral pattern.

29. The multi charged-particle beam apparatus of any one of clauses 20-28, wherein the optical axis is a secondary optical axis of the electro-optical system.

30. The multi charged-particle beam apparatus of any one of clauses 20-29, wherein the first aperture is placed away from the second aperture along a second axis perpendicular to the optical axis.

31. The multi charged-particle beam apparatus of any one of clauses 20-30, wherein the plurality of secondary charged-particle beams overlap to create a crossover area on a crossover plane perpendicular to the optical axis of the electro-optical system.

32. The multi charged-particle beam apparatus of any one of clauses 20-31, wherein the first aperture and the second aperture of the beam-limit aperture plate are located on or within a range of positions of a crossover plane perpendicular to the optical axis.

33. The multi charged-particle beam apparatus of clause 32, wherein the range of positions of the crossover plane is determined based on a landing energy of the plurality of primary charged-particle beams on the sample or an excitation of objective lens.

34. The multi charged-particle beam apparatus of any one of clauses 20-33, wherein the beam-limit aperture plate is movable along a second axis perpendicular to the optical axis.

35. The multi charged-particle beam apparatus of any one of clauses 20-34, wherein the beam-limit aperture plate is not movable along the optical axis.

36. The multi charged-particle beam apparatus of any one of clauses 20-33, wherein the beam-limit aperture plate is configured to move along a second axis perpendicular to the optical axis to position the first aperture at a first position and the second aperture at a second position, wherein the first aperture is aligned with the plurality of secondary charged-particle beams that overlap to form a first crossover plane at the first distance, wherein the second aperture is aligned with the plurality of secondary charged-particle beams that overlap to form a second crossover plane at the second distance, and wherein the first and second crossover planes are substantially perpendicular to the optical axis.

37. The multi charged-particle beam apparatus of any one of clauses 20-36, wherein the first aperture and the second aperture have different sizes.

38. A method of controlling a beam-limit aperture plate of a secondary imaging system to form images of a sample, the method comprising:
determining a position of a crossover plane associated with a plurality of secondary charged-particle beams generated from the sample;

determining a location for moving the beam-limit aperture plate to position one of a plurality of apertures of the beam-limit aperture plate in the crossover plane to cause the one of the plurality of apertures to align with the plurality of secondary charged-particle beams, wherein the beam-limit aperture plate has a surface positioned substantially perpendicular to an optical axis, the beam-limit aperture plate comprising:
  a first aperture of the plurality of apertures, wherein the first aperture is at a first distance relative to the surface of the beam-limit aperture plate, and
  a second aperture of the plurality of apertures, wherein the second aperture is at a second distance relative to the surface of the beam-limit aperture plate, the second distance being different from the first distance; and
moving, according to the determined location, the beam-limit aperture plate along a second axis substantially perpendicular to the optical axis to position the one of the plurality of apertures to be aligned with the plurality of secondary charged-particle beams that overlap to form the crossover plane.

39. The method of clause 38, further comprising:
determining a change of the position of the crossover plane based on a change of a landing energy of the plurality of primary charged-particle beams on the sample or an excitation of object lens; and
moving the beam-limit aperture plate along the second axis to position the first aperture at a first position and the second aperture at a second position, wherein the first aperture is aligned with the plurality of secondary charged-particle beams that overlap to form a first crossover plane at the first distance, wherein the second aperture is aligned with the plurality of secondary charged-particle beams that overlap to form a second crossover plane at the second distance, and wherein the first and second crossover planes are substantially perpendicular to the optical axis.

40. The method of any one of clauses 38-39, further comprising:
providing a recommendation for moving the beam-limit aperture plate to align one of the plurality of apertures of the beam-limit aperture plate with the plurality of secondary charged-particle beams that overlap to form the crossover plane at the determined position.

41. The method of any one of clauses 38-40, wherein the beam-limit aperture plate is movable along a second axis substantially perpendicular to the optical axis.

42. The method of any one of clauses 38-41, wherein the beam-limit aperture plate is not movable along the optical axis.

43. The method of any one of clauses 38-42, wherein the beam-limit aperture plate is moved along a plane substantially perpendicular to the optical axis and in a rotational movement.

44. The method of any one of clauses 38-43, wherein the first and second apertures have a same diameter.

45. The method of any one of clauses 38-43, wherein the first aperture and the second aperture have different sizes.

46. The method of any one of clauses 38-45, wherein the first aperture is a part of a first set of apertures of the beam-limit aperture plate at the first distance.

47. The method of any one of clauses 38-46, wherein the second aperture is a part of a second set of apertures of the beam-limit aperture plate at the second distance.

48. The method of any one of clauses 38-47, wherein the secondary imaging system comprises a charged-particle detector including a plurality of detection elements, wherein a respective detection element of the plurality of detection elements is associated with a corresponding beam of a plurality of secondary charged-particle beams.

49. The method of any one of clauses 38-48, wherein a distance between the first distance and the second distance is 10 mm or less.

50. The method of any one of clauses 38-49, wherein the plurality of secondary charged-particle beams comprises at least one of secondary electrons or back-scattered electrons generated from the sample in response to an interaction between a plurality of primary charged-particle beams and the sample.

51. The method of any one of clauses 38-50, wherein at least two apertures of the first set of apertures have different sizes.

52. The method of any one of clauses 38-51, wherein the plurality of apertures of the first set are arranged in a linear, a rectangular, a circular, or a spiral pattern.

53. The method of any one of clauses 38-52, wherein at least two apertures of the second set of apertures have different sizes.

54. The method of any one of clauses 38-52, wherein the plurality of apertures of the second set are arranged in a linear, a rectangular, a circular, or a spiral pattern.

55. The method of any one of clauses 36-52, wherein the optical axis is a secondary optical axis of the electro-optical system.

56. The method of any one of clauses 38-55, wherein the first aperture and the second aperture of the beam-limit aperture plate are located on or within a range of positions of a crossover plane perpendicular to the optical axis.

57. A non-transitory computer readable medium that stores a set of instructions that is executable by at least one processor of an electro-optical system to cause the electro-optical system to perform a method of controlling a beam-limit aperture plate of the electro-optical system to form images of a sample, the method comprising:
determining a position of a crossover plane associated with a plurality of secondary charged-particle beams generated from the sample;
determining a location for moving the beam-limit aperture plate to position one of a plurality of apertures of the beam-limit aperture plate in the crossover plane to cause the one of the plurality of apertures to align with the plurality of secondary charged-particle beams, wherein the beam-limit aperture plate has a surface positioned substantially perpendicular to an optical axis, the beam-limit aperture plate comprising:
  a first aperture and a second aperture of the plurality of apertures, the first aperture at a first distance relative to the surface of the beam-limit aperture plate, and the second aperture at a second distance relative to the surface of the beam-limit aperture plate, the second distance being different from the first distance; and
moving, according to the determined location, the beam-limit aperture plate along a second axis substantially perpendicular to the optical axis to position the one of the plurality of apertures to be aligned with the plurality of secondary charged-particle beams that overlap to form the crossover plane.

58. The non-transitory computer readable medium of clause 57, wherein the set of instructions that is executable by the at least one processor of an electro-optical system to cause the electro-optical system to further perform:
determining a change of the position of the crossover plane based on a change of a landing energy of the plurality of primary charged-particle beams on the sample or an excitation of object lens; and moving the beam-limit aperture plate along the second axis to position the first aperture at a first position and the second aperture at a second position, wherein the first aperture is aligned with the plurality of secondary charged-particle beams that overlap to form a first crossover plane at the first distance, wherein the second aperture is aligned with the plurality of secondary charged-particle beams that overlap to form a second crossover plane at the second distance, and wherein the first and second crossover planes are substantially perpendicular to the optical axis.

59. The non-transitory computer readable medium of any one of clauses 57-58, wherein the set of instructions that is executable by the at least one processor of an electro-optical system to cause the electro-optical system to further perform:

providing a recommendation for moving the beam-limit aperture plate to align one of the plurality of apertures of the beam-limit aperture plate with the plurality of secondary charged-particle beams that overlap to form the crossover plane at the determined position.

60. The non-transitory computer readable medium of any one of clauses 57-59, wherein the beam-limit aperture plate is movable along a second axis substantially perpendicular to the optical axis.

61. The non-transitory computer readable medium of any one of clauses 57-60, wherein the beam-limit aperture plate is not movable along the optical axis.

62. The non-transitory computer readable medium of any one of clauses 57-61, wherein the beam-limit aperture plate is moved along a plane substantially perpendicular to the optical axis and in a rotational movement.

63. The non-transitory computer readable medium of any one of clauses 57-62, wherein the first and second apertures have a same diameter.

64. The non-transitory computer readable medium of any one of clauses 57-62, wherein the first aperture and the second aperture have different sizes.

65. The non-transitory computer readable medium of any one of clauses 57-64, wherein the first aperture is a part of a first set of apertures of the beam-limit aperture plate at the first distance.

66. The non-transitory computer readable medium of any one of clauses 57-65, wherein the second aperture is a part of a second set of apertures of the beam-limit aperture plate at the second distance.

67. The non-transitory computer readable medium of any one of clauses 57-66, wherein the secondary imaging system comprises a charged-particle detector including a plurality of detection elements, wherein a respective detection element of the plurality of detection elements is associated with a corresponding beam of a plurality of secondary charged-particle beams.

68. The non-transitory computer readable medium of any one of clauses 57-67, wherein a distance between the first distance and the second distance is 10 mm or less.

69. The non-transitory computer readable medium of any one of clauses 57-68, wherein the plurality of secondary charged-particle beams comprises at least one of secondary electrons or back-scattered electrons generated from the sample in response to an interaction between a plurality of primary charged-particle beams and the sample.

70. The non-transitory computer readable medium of any one of clauses 57-69, wherein at least two apertures of the first set of apertures have different sizes.

71. The non-transitory computer readable medium of any one of clauses 57-70, wherein the plurality of apertures of the first set are arranged in a linear, a rectangular, a circular, or a spiral pattern.

72. The non-transitory computer readable medium of any one of clauses 57-71, wherein at least two apertures of the second set of apertures have different sizes.

73. The non-transitory computer readable medium of any one of clauses 57-72, wherein the plurality of apertures of the second set are arranged in a linear, a rectangular, a circular, or a spiral pattern.

74. The non-transitory computer readable medium of any one of clauses 57-73, wherein the optical axis is a secondary optical axis of the electro-optical system.

75. The non-transitory computer readable medium of any one of clauses 57-74, wherein the first aperture and the second aperture of the beam-limit aperture plate are located on or within a range of positions of a crossover plane perpendicular to the optical axis.

The descriptions above are intended to be illustrative, not limiting. Thus, it will be apparent to one skilled in the art that modifications may be made as described without departing from the scope of the claims set out below. For example, a charged particle inspection system may be but one example of a charged particle beam system consistent with embodiments of the present disclosure.

The invention claimed is:

1. A multi charged-particle beam apparatus comprising:
an electro-optical system for projecting a plurality of secondary charged-particle beams from a sample onto a charged-particle detector, the electro-optical system comprising a beam-limit aperture plate having a surface that is substantially perpendicular to an optical axis, the beam-limit aperture plate comprising:
a first aperture at a first distance relative to the surface of the beam-limit aperture plate; and
a second aperture at a second distance relative to the surface of the beam-limit aperture plate, wherein the second distance is different from the first distance,
wherein the charged-particle detector includes a plurality of detection elements, a respective detection element of the plurality of detection elements being associated with a corresponding beam of a plurality of secondary charged-particle beams.

2. The multi charged-particle beam apparatus of claim 1, wherein the first aperture is a part of a first set of apertures of the beam-limit aperture plate at the first distance.

3. The multi charged-particle beam apparatus of claim 2, wherein the second aperture is a part of a second set of apertures of the beam-limit aperture plate at the second distance.

4. The multi charged-particle beam apparatus of claim 3, wherein a distance between the first distance and the second distance is 10 mm or less.

5. The multi charged-particle beam apparatus of claim 3, wherein at least one set of the first and second sets of apertures comprises a plurality of apertures of different sizes.

6. The multi charged-particle beam apparatus of claim 3, wherein the plurality of apertures of at least one set of the first and second sets are arranged in a linear, a rectangular, a circular, or a spiral pattern.

7. The multi charged-particle beam apparatus of claim 1, wherein the optical axis is a secondary optical axis of the electro-optical system.

8. The multi charged-particle beam apparatus of claim 1, wherein the first aperture is placed away from the second aperture along a second axis perpendicular to the optical axis.

9. The multi charged-particle beam apparatus of claim 1, wherein the plurality of secondary charged-particle beams overlap to create a crossover area on a crossover plane perpendicular to the optical axis of the electro-optical system.

10. The multi charged-particle beam apparatus of claim 9, wherein the first aperture and the second aperture of the beam-limit aperture plate are located on or within a range of positions of a crossover plane perpendicular to the optical axis.

11. The multi charged-particle beam apparatus of claim 10, wherein the range of positions of the crossover plane is determined based on a landing energy of the plurality of primary charged-particle beams on the sample or an excitation of objective lens.

12. The multi charged-particle beam apparatus of claim 9, wherein the beam-limit aperture plate is configured to move along a second axis perpendicular to the optical axis to position the first aperture at a first position and the second aperture at a second position, wherein the first aperture is aligned with the plurality of secondary charged-particle beams that overlap to form a first crossover plane at the first distance, wherein the second aperture is aligned with the plurality of secondary charged-particle beams that overlap to form a second crossover plane at the second distance, and wherein the first and second crossover planes are substantially perpendicular to the optical axis.

13. The multi charged-particle beam apparatus of claim 1, wherein the beam-limit aperture plate is not movable along the optical axis.

14. The multi charged-particle beam apparatus of claim 1, wherein the first aperture and the second aperture have different sizes.

15. The multi charged-particle beam apparatus of claim 1, further comprising a charged-particle detector including a plurality of detection elements, wherein a respective detection element of the plurality of detection elements is associated with a corresponding beam of a plurality of secondary charged-particle beams.

16. The multi charged-particle beam apparatus of claim 1, wherein the plurality of secondary charged-particle beams comprises at least one of secondary electrons or backscattered electrons generated from the sample in response to an interaction between a plurality of primary charged-particle beams and the sample.

17. The multi charged-particle beam apparatus of claim 1, wherein the first aperture and the second aperture have different sizes.

18. A non-transitory computer readable medium that stores a set of instructions that is executable by at least one processor of an electro-optical system to cause the electro-optical system to perform a method of controlling a beam-limit aperture plate of the electro-optical system to form images of a sample, the method comprising:
   determining a position of a crossover plane associated with a plurality of secondary charged-particle beams generated from the sample;
   determining a location for moving the beam-limit aperture plate to position one of a plurality of apertures of the beam-limit aperture plate in the crossover plane to cause the one of the plurality of apertures to align with the plurality of secondary charged-particle beams, wherein the beam-limit aperture plate has a surface positioned substantially perpendicular to an optical axis, the beam-limit aperture plate comprising:
      a first aperture and a second aperture of the plurality of apertures, the first aperture at a first distance relative to the surface of the beam-limit aperture plate, and the second aperture at a second distance relative to the surface of the beam-limit aperture plate, the second distance being different from the first distance; and
   moving, according to the determined location, the beam-limit aperture plate along a second axis substantially perpendicular to the optical axis to position the one of the plurality of apertures to be aligned with the plurality of secondary charged-particle beams that overlap to form the crossover plane.

19. The non-transitory computer readable medium of claim 18, wherein the set of instructions that is executable by the at least one processor of an electro-optical system to cause the electro-optical system to further perform:
   determining a change of the position of the crossover plane based on a change of a landing energy of the plurality of primary charged-particle beams on the sample or an excitation of object lens; and
   moving the beam-limit aperture plate along the second axis to position the first aperture at a first position and the second aperture at a second position, wherein the first aperture is aligned with the plurality of secondary charged-particle beams that overlap to form a first crossover plane at the first distance, wherein the second aperture is aligned with the plurality of secondary charged-particle beams that overlap to form a second crossover plane at the second distance, and wherein the first and second crossover planes are substantially perpendicular to the optical axis.

20. A method of controlling a beam-limit aperture plate of a secondary imaging system to form images of a sample, the method comprising:
   determining a position of a crossover plane associated with a plurality of secondary charged-particle beams generated from the sample;
   determining a location for moving the beam-limit aperture plate to position one of a plurality of apertures of the beam-limit aperture plate in the crossover plane to cause the one of the plurality of apertures to align with the plurality of secondary charged-particle beams, wherein the beam-limit aperture plate has a surface positioned substantially perpendicular to an optical axis, the beam-limit aperture plate comprising:
      a first aperture of the plurality of apertures, wherein the first aperture is at a first distance relative to the surface of the beam-limit aperture plate, and
      a second aperture of the plurality of apertures, wherein the second aperture is at a second distance relative to the surface of the beam-limit aperture plate, the second distance being different from the first distance; and
   moving, according to the determined location, the beam-limit aperture plate along a second axis substantially perpendicular to the optical axis to position the one of the plurality of apertures to be aligned with the plurality of secondary charged-particle beams that overlap to form the crossover plane.

* * * * *